United States Patent
Gleason et al.

(10) Patent No.: US 7,533,462 B2
(45) Date of Patent: May 19, 2009

(54) METHOD OF CONSTRUCTING A MEMBRANE PROBE

(75) Inventors: Reed Gleason, Portland, OR (US); Michael A. Bayne, Beaverton, OR (US); Kenneth Smith, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 11/607,156

(22) Filed: Dec. 1, 2006

(65) Prior Publication Data

US 2007/0074392 A1 Apr. 5, 2007

Related U.S. Application Data

(63) Continuation of application No. 10/418,510, filed on Apr. 16, 2003, now Pat. No. 7,178,236, which is a continuation of application No. 09/546,927, filed on Apr. 11, 2000, now Pat. No. 6,578,264.

(60) Provisional application No. 60/137,759, filed on Jun. 4, 1999.

(51) Int. Cl.
*H01R 43/16* (2006.01)
*H01R 43/00* (2006.01)

(52) U.S. Cl. .............. 29/874; 29/825; 29/846; 29/876; 29/879

(58) Field of Classification Search .......... 29/825, 29/846, 848, 874, 876, 879, 884
See application file for complete search history.

(56) References Cited

U.S. PATENT DOCUMENTS 1,337,866 A 4/1920 Whitacker (Continued)

FOREIGN PATENT DOCUMENTS

CN 1083975 3/1994

(Continued)

OTHER PUBLICATIONS

Fink, Donald G., et. al., "Bridge Circuits, Detectors and Amplifiers—Principles of Bridge Measurements," Electronics Engineer's Handbook, First Edition, 1975, pp. 17-22-17-27, McGraw-Hill Book Company, New York.

(Continued)

*Primary Examiner*—C. J Arbes
(74) *Attorney, Agent, or Firm*—Chernoff, Vilhauer, McClung & Stenzel

(57) ABSTRACT

A substrate, preferably constructed of a ductile material and a tool having the desired shape of the resulting device for contacting contact pads on a test device is brought into contact with the substrate. The tool is preferably constructed of a material that is harder than the substrate so that a depression can be readily made therein. A dielectric (insulative) layer, that is preferably patterned, is supported by the substrate. A conductive material is located within the depressions and then preferably lapped to remove excess from the top surface of the dielectric layer and to provide a flat overall surface. A trace is patterned on the dielectric layer and the conductive material. A polyimide layer is then preferably patterned over the entire surface. The substrate is then removed by any suitable process.

15 Claims, 23 Drawing Sheets

U.S. PATENT DOCUMENTS

| | | | |
|---|---|---|---|
| 2,142,625 A | 1/1939 | Zoethout |
| 2,376,101 A | 5/1945 | Tyzzer |
| 2,389,668 A | 11/1945 | Johnson |
| 3,176,091 A | 3/1965 | Hanson et al. |
| 3,193,712 A | 7/1965 | Harris |
| 3,230,299 A | 1/1966 | Radziekowski |
| 3,401,126 A | 9/1968 | Miller et al. |
| 3,429,040 A | 2/1969 | Miller |
| 3,441,315 A | 4/1969 | Paes et al. |
| 3,442,831 A | 5/1969 | Dickstein |
| 3,445,770 A | 5/1969 | Harmon |
| 3,484,679 A | 12/1969 | Hodgson et al. |
| 3,541,222 A | 11/1970 | Parks et al. |
| 3,595,228 A | 7/1971 | Simon |
| 3,596,228 A | 7/1971 | Reed, Jr. et al. |
| 3,609,539 A | 9/1971 | Gunthert |
| 3,634,807 A | 1/1972 | Grobe et al. |
| 3,654,585 A | 4/1972 | Wickersham |
| 3,680,037 A | 7/1972 | Nellis et al. |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,806,801 A | 4/1974 | Bove |
| 3,829,076 A | 8/1974 | Sofy |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,008,900 A | 2/1977 | Khoshaba |
| 4,027,935 A | 6/1977 | Byrnes et al. |
| 4,038,599 A | 7/1977 | Bove et al. |
| 4,038,894 A | 8/1977 | Knibbe et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,135,131 A | 1/1979 | Larsen et al. |
| 4,184,729 A | 1/1980 | Parks et al. |
| 4,275,446 A | 6/1981 | Blaess |
| 4,277,741 A | 7/1981 | Faxvog et al. |
| 4,284,033 A | 8/1981 | del Rio |
| 4,284,682 A | 8/1981 | Tshirch et al. |
| 4,287,473 A | 9/1981 | Sawyer |
| 4,312,117 A | 1/1982 | Robillard et al. |
| 4,327,180 A | 4/1982 | Chen |
| 4,330,783 A | 5/1982 | Toia |
| 4,357,575 A | 11/1982 | Uren et al. |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,487,996 A | 12/1984 | Rabinowitz et al. |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,552,033 A | 11/1985 | Marzhauser |
| 4,567,321 A | 1/1986 | Harayama |
| 4,581,679 A | 4/1986 | Smolley |
| 4,588,950 A | 5/1986 | Henley |
| 4,593,243 A | 6/1986 | Lao et al. |
| 4,621,169 A | 11/1986 | Petinelli et al. |
| 4,626,618 A | 12/1986 | Takaoka et al. |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,663,840 A | 5/1987 | Ubbens et al. |
| 4,673,839 A | 6/1987 | Veenendaal |
| 4,684,883 A | 8/1987 | Ackerman et al. |
| 4,691,163 A | 9/1987 | Blass et al. |
| 4,697,143 A | 9/1987 | Lockwood et al. |
| 4,705,447 A | 11/1987 | Smith |
| 4,707,657 A | 11/1987 | Bøegh-Peterson |
| 4,711,563 A | 12/1987 | Lass |
| 4,713,347 A | 12/1987 | Mitchell et al. |
| 4,725,793 A | 2/1988 | Igarashi |
| 4,727,391 A | 2/1988 | Tajima et al. |
| 4,727,637 A | 3/1988 | Buckwitz et al. |
| 4,742,571 A | 5/1988 | Letron |
| 4,744,041 A | 5/1988 | Strunk et al. |
| 4,746,857 A | 5/1988 | Sakai et al. |
| 4,749,942 A | 6/1988 | Sang et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,766,384 A | 8/1988 | Kleinberg et al. |
| 4,772,846 A | 9/1988 | Reeds |
| 4,780,670 A | 10/1988 | Cherry |
| 4,791,363 A | 12/1988 | Logan |
| 4,793,814 A | 12/1988 | Zifcak et al. |
| 4,795,962 A | 1/1989 | Yanagawa et al. |
| 4,805,627 A | 2/1989 | Klingenbeck et al. |
| 4,812,754 A | 3/1989 | Tracy et al. |
| 4,827,211 A | 5/1989 | Strid et al. |
| 4,831,494 A | 5/1989 | Arnold et al. |
| 4,837,507 A | 6/1989 | Hechtman |
| 4,839,587 A | 6/1989 | Flatley et al. |
| 4,849,689 A | 7/1989 | Gleason et al. |
| 4,853,624 A | 8/1989 | Rabjohn |
| 4,853,627 A | 8/1989 | Gleason et al. |
| 4,859,989 A | 8/1989 | McPherson |
| 4,864,227 A | 9/1989 | Sato |
| 4,871,883 A | 10/1989 | Guiol |
| 4,871,964 A | 10/1989 | Boll et al. |
| 4,891,584 A | 1/1990 | Kamieniecki et al. |
| 4,893,914 A | 1/1990 | Hancock et al. |
| 4,894,612 A | 1/1990 | Drake et al. |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,912,399 A | 3/1990 | Greub et al. |
| 4,916,002 A | 4/1990 | Carver |
| 4,916,398 A | 4/1990 | Rath |
| 4,918,383 A | 4/1990 | Huff et al. |
| 4,922,128 A | 5/1990 | Dhong et al. |
| 4,922,186 A | 5/1990 | Tsuchiya et al. |
| 4,922,192 A | 5/1990 | Gross et al. |
| 4,929,893 A | 5/1990 | Sato et al. |
| 4,975,638 A | 12/1990 | Evans et al. |
| 4,980,637 A | 12/1990 | Huff et al. |
| 4,983,910 A | 1/1991 | Majidi-Ahy et al. |
| 4,987,100 A | 1/1991 | McBride et al. |
| 4,991,290 A | 2/1991 | MacKay |
| 4,998,062 A | 3/1991 | Ikeda |
| 5,001,423 A | 3/1991 | Abrami et al. |

| Patent | Date | Inventor |
|---|---|---|
| 5,003,253 A | 3/1991 | Majidi-Ahy et al. |
| 5,020,219 A | 6/1991 | Leedy |
| 5,021,186 A | 6/1991 | Ota et al. |
| 5,030,907 A | 7/1991 | Yih et al. |
| 5,041,782 A | 8/1991 | Marzan |
| 5,045,781 A | 9/1991 | Gleason et al. |
| 5,059,898 A | 10/1991 | Barsotti et al. |
| 5,061,192 A | 10/1991 | Chapin et al. |
| 5,061,823 A | 10/1991 | Carroll |
| 5,066,357 A | 11/1991 | Smyth, Jr. et al. |
| 5,069,628 A | 12/1991 | Crumly |
| 5,082,627 A | 1/1992 | Stanbro |
| 5,084,671 A | 1/1992 | Miyata et al. |
| 5,089,774 A | 2/1992 | Nakano |
| 5,091,692 A | 2/1992 | Ohno et al. |
| 5,091,732 A | 2/1992 | Mileski et al. |
| 5,095,891 A | 3/1992 | Reitter |
| 5,097,101 A | 3/1992 | Trobough |
| 5,097,207 A | 3/1992 | Blanz |
| 5,107,076 A | 4/1992 | Bullock et al. |
| 5,126,286 A | 6/1992 | Chance |
| 5,133,119 A | 7/1992 | Afshari et al. |
| 5,134,365 A | 7/1992 | Okubo et al. |
| 5,136,237 A | 8/1992 | Smith et al. |
| 5,142,224 A | 8/1992 | Smith et al. |
| 5,145,552 A | 9/1992 | Yoshizawa et al. |
| 5,148,103 A | 9/1992 | Pasiecznik, Jr. |
| 5,159,264 A | 10/1992 | Anderson |
| 5,159,267 A | 10/1992 | Anderson |
| 5,159,752 A | 11/1992 | Mahant-Shetti et al. |
| 5,160,883 A | 11/1992 | Blanz |
| 5,164,319 A | 11/1992 | Hafeman et al. |
| 5,166,606 A | 11/1992 | Blanz |
| 5,172,049 A | 12/1992 | Kiyokawa et al. |
| 5,172,050 A | 12/1992 | Swapp |
| 5,172,051 A | 12/1992 | Zamborelli |
| 5,177,438 A | 1/1993 | Littlebury et al. |
| 5,180,977 A | 1/1993 | Huff |
| 5,187,443 A | 2/1993 | Bereskin |
| 5,198,752 A | 3/1993 | Miyata et al. |
| 5,198,753 A | 3/1993 | Hamburgen |
| 5,202,558 A | 4/1993 | Barker |
| 5,207,585 A | 5/1993 | Byrnes et al. |
| 5,214,243 A | 5/1993 | Johnson |
| 5,214,374 A | 5/1993 | St. Onge |
| 5,225,037 A | 7/1993 | Elder et al. |
| 5,227,730 A | 7/1993 | King et al. |
| 5,232,789 A | 8/1993 | Platz et al. |
| 5,233,197 A | 8/1993 | Bowman et al. |
| 5,233,306 A | 8/1993 | Misra |
| 5,245,292 A | 9/1993 | Milesky et al. |
| 5,266,889 A | 11/1993 | Harwood et al. |
| 5,267,088 A | 11/1993 | Nomura |
| 5,270,664 A | 12/1993 | McMurtry et al. |
| 5,274,336 A | 12/1993 | Crook et al. |
| 5,280,156 A | 1/1994 | Niori et al. |
| 5,293,175 A | 3/1994 | Hemmie et al. |
| 5,298,972 A | 3/1994 | Heffner |
| 5,304,924 A | 4/1994 | Yamano et al. |
| 5,313,157 A | 5/1994 | Pasiecznik, Jr. |
| 5,315,237 A | 5/1994 | Iwakura et al. |
| 5,321,352 A | 6/1994 | Takebuchi |
| 5,321,453 A | 6/1994 | Mori et al. |
| 5,326,412 A | 7/1994 | Schreiber et al. |
| 5,355,079 A | 10/1994 | Evans et al. |
| 5,357,211 A | 10/1994 | Bryson et al. |
| 5,363,050 A | 11/1994 | Guo et al. |
| 5,367,165 A | 11/1994 | Toda et al. |
| 5,368,634 A | 11/1994 | Hackett |
| 5,369,368 A | 11/1994 | Kassen et al. |
| 5,371,654 A | 12/1994 | Beaman et al. |
| 5,373,231 A | 12/1994 | Boll et al. |
| 5,374,938 A | 12/1994 | Hatazawa et al. |
| 5,376,790 A | 12/1994 | Linker et al. |
| 5,389,885 A | 2/1995 | Swart |
| 5,395,253 A | 3/1995 | Crumly |
| 5,397,855 A | 3/1995 | Ferlier |
| 5,404,111 A | 4/1995 | Mori et al. |
| 5,408,188 A | 4/1995 | Katoh |
| 5,408,189 A | 4/1995 | Swart et al. |
| 5,412,330 A | 5/1995 | Ravel et al. |
| 5,412,866 A | 5/1995 | Woith et al. |
| 5,414,565 A | 5/1995 | Sullivan et al. |
| 5,422,574 A | 6/1995 | Kister |
| 5,441,690 A | 8/1995 | Ayala-Esquilin et al. |
| 5,451,722 A | 9/1995 | Gregoire |
| 5,451,884 A | 9/1995 | Sauerland |
| 5,453,404 A | 9/1995 | Leedy |
| 5,457,398 A | 10/1995 | Schwindt et al. |
| 5,467,024 A | 11/1995 | Swapp |
| 5,469,324 A | 11/1995 | Henderson et al. |
| 5,475,316 A | 12/1995 | Hurley et al. |
| 5,476,211 A | 12/1995 | Khandros |
| 5,477,011 A | 12/1995 | Singles et al. |
| 5,478,748 A | 12/1995 | Akins, Jr. et al. |
| 5,479,108 A | 12/1995 | Cheng |
| 5,479,109 A | 12/1995 | Lau et al. |
| 5,481,196 A | 1/1996 | Nosov |
| 5,481,936 A | 1/1996 | Yanagisawa |
| 5,487,999 A | 1/1996 | Farnworth |
| 5,488,954 A | 2/1996 | Sleva et al. |
| 5,493,070 A | 2/1996 | Habu |
| 5,493,236 A | 2/1996 | Ishii et al. |
| 5,500,606 A | 3/1996 | Holmes |
| 5,505,150 A | 4/1996 | James et al. |
| 5,506,498 A | 4/1996 | Anderson et al. |
| 5,506,515 A | 4/1996 | Godshalk et al. |
| 5,510,792 A | 4/1996 | Ono et al. |
| 5,511,010 A | 4/1996 | Burns |
| 5,512,835 A | 4/1996 | Rivera et al. |
| 5,517,126 A | 5/1996 | Yamaguchi |
| 5,521,518 A | 5/1996 | Higgins |
| 5,521,522 A | 5/1996 | Abe et al. |
| 5,523,694 A | 6/1996 | Cole, Jr. |
| 5,528,158 A | 6/1996 | Sinsheimer et al. |
| 5,530,372 A | 6/1996 | Lee et al. |
| 5,531,022 A | 7/1996 | Beaman et al. |
| 5,532,608 A | 7/1996 | Behfar-Rad et al. |
| 5,537,372 A | 7/1996 | Albrecht et al. |
| 5,539,323 A | 7/1996 | Davis, Jr. |
| 5,539,676 A | 7/1996 | Yamaguchi |
| 5,565,788 A | 10/1996 | Burr et al. |
| 5,565,881 A | 10/1996 | Phillips et al. |
| 5,569,591 A | 10/1996 | Kell et al. |
| 5,571,324 A | 11/1996 | Sago et al. |
| 5,578,932 A | 11/1996 | Adamian |
| 5,583,445 A | 12/1996 | Mullen |
| 5,584,120 A | 12/1996 | Roberts |
| 5,584,608 A | 12/1996 | Gillespie |
| 5,589,781 A | 12/1996 | Higgins et al. |
| 5,600,256 A | 2/1997 | Woith et al. |
| 5,601,740 A | 2/1997 | Eldrigde et al. |
| 5,610,529 A | 3/1997 | Schwindt |
| 5,617,035 A | 4/1997 | Swapp |
| 5,623,213 A | 4/1997 | Liu et al. |
| 5,623,214 A | 4/1997 | Pasiecznik, Jr. |
| 5,628,057 A | 5/1997 | Phillips et al. |
| 5,631,571 A | 5/1997 | Spaziani et al. |
| 5,633,780 A | 5/1997 | Cronin |
| 5,634,267 A | 6/1997 | Farnworth et al. |
| 5,635,846 A | 6/1997 | Beaman et al. |
| 5,642,298 A | 6/1997 | Mallory et al. |
| 5,644,248 A | 7/1997 | Fujimoto |
| 5,653,939 A | 8/1997 | Hollis et al. |
| 5,656,942 A | 8/1997 | Watts et al. |
| 5,659,421 A | 8/1997 | Rahmel et al. |

| | | | | | |
|---|---|---|---|---|---|
| 5,666,063 A | 9/1997 | Abercrombie et al. | 5,910,727 A | 6/1999 | Fujihara et al. |
| 5,669,316 A | 9/1997 | Faz et al. | 5,912,046 A | 6/1999 | Eldridge et al. |
| 5,670,322 A | 9/1997 | Eggers et al. | 5,914,613 A | 6/1999 | Gleason et al. |
| 5,670,888 A | 9/1997 | Cheng | 5,914,614 A | 6/1999 | Beaman et al. |
| 5,672,816 A | 9/1997 | Park et al. | 5,916,689 A | 6/1999 | Collins et al. |
| 5,675,499 A | 10/1997 | Lee et al. | 5,917,707 A | 6/1999 | Khandros et al. |
| 5,675,932 A | 10/1997 | Mauney | 5,926,029 A | 7/1999 | Ference et al. |
| 5,676,360 A | 10/1997 | Boucher et al. | 5,926,951 A | 7/1999 | Khandros et al. |
| 5,685,232 A | 11/1997 | Inoue | 5,944,093 A | 8/1999 | Viswanath |
| 5,686,317 A | 11/1997 | Akram et al. | 5,945,836 A | 8/1999 | Sayre et al. |
| 5,700,844 A | 12/1997 | Hedrick et al. | 5,949,383 A | 9/1999 | Hayes et al. |
| 5,704,355 A | 1/1998 | Bridges | 5,949,579 A | 9/1999 | Baker |
| 5,715,819 A | 2/1998 | Svenson et al. | 5,959,461 A | 9/1999 | Brown et al. |
| 5,720,098 A | 2/1998 | Kister | 5,963,364 A | 10/1999 | Leong et al. |
| 5,723,347 A | 3/1998 | Hirano et al. | 5,970,429 A | 10/1999 | Martin |
| 5,726,211 A | 3/1998 | Hedrick et al. | 5,973,504 A | 10/1999 | Chong |
| 5,731,920 A | 3/1998 | Katsuragawa | 5,974,662 A | 11/1999 | Eldridge et al. |
| 5,742,174 A | 4/1998 | Kister et al. | 5,981,268 A | 11/1999 | Kovacs et al. |
| 5,744,383 A | 4/1998 | Fritz | 5,982,166 A | 11/1999 | Mautz |
| 5,744,971 A | 4/1998 | Chan et al. | 5,983,493 A | 11/1999 | Eldridge et al. |
| 5,748,506 A | 5/1998 | Bockelman | 5,990,695 A | 11/1999 | Daugherty, Jr. |
| 5,751,252 A | 5/1998 | Phillips | 5,993,611 A | 11/1999 | Moroney, III et al. |
| 5,756,021 A | 5/1998 | Hedrick et al. | 5,994,152 A | 11/1999 | Khandros et al. |
| 5,767,690 A | 6/1998 | Fujimoto | 5,995,914 A | 11/1999 | Cabot |
| 5,772,451 A | 6/1998 | Dozier, II et al. | 5,996,102 A | 11/1999 | Haulin |
| 5,773,780 A | 6/1998 | Eldridge et al. | 5,998,228 A | 12/1999 | Eldridge et al. |
| 5,777,485 A | 7/1998 | Tanaka et al. | 5,998,768 A | 12/1999 | Hunter et al. |
| 5,785,538 A | 7/1998 | Beaman et al. | 5,998,864 A | 12/1999 | Khandros et al. |
| 5,792,668 A | 8/1998 | Fuller et al. | 5,999,268 A | 12/1999 | Yonezawa et al. |
| 5,793,213 A | 8/1998 | Bockelman et al. | 6,001,760 A | 12/1999 | Katsuda et al. |
| 5,794,133 A | 8/1998 | Kashima | 6,002,426 A | 12/1999 | Back et al. |
| 5,804,607 A | 9/1998 | Hedrick et al. | 6,013,586 A | 1/2000 | McGhee et al. |
| 5,804,982 A | 9/1998 | Lo et al. | 6,019,612 A | 2/2000 | Hasegawa et al. |
| 5,804,983 A | 9/1998 | Nakajima et al. | 6,020,745 A | 2/2000 | Taraci |
| 5,806,181 A | 9/1998 | Khandros et al. | 6,023,103 A | 2/2000 | Chang et al. |
| 5,807,107 A | 9/1998 | Bright et al. | 6,028,435 A | 2/2000 | Nikawa |
| 5,810,607 A | 9/1998 | Shih et al. | 6,029,344 A | 2/2000 | Khandros et al. |
| 5,811,751 A | 9/1998 | Leong et al. | 6,031,383 A | 2/2000 | Streib et al. |
| 5,811,982 A | 9/1998 | Beaman et al. | 6,032,356 A | 3/2000 | Eldridge et al. |
| 5,813,847 A | 9/1998 | Eroglu et al. | 6,032,714 A | 3/2000 | Fenton |
| 5,814,847 A | 9/1998 | Shihadeh et al. | 6,033,935 A | 3/2000 | Dozier, II et al. |
| 5,820,014 A | 10/1998 | Dozier, II et al. | 6,034,533 A | 3/2000 | Tervo et al. |
| 5,821,763 A | 10/1998 | Beaman et al. | 6,037,785 A | 3/2000 | Higgins |
| 5,824,494 A | 10/1998 | Feldberg | 6,042,712 A | 3/2000 | Mathieu |
| 5,829,128 A | 11/1998 | Eldridge et al. | 6,043,563 A | 3/2000 | Eldridge et al. |
| 5,829,437 A | 11/1998 | Bridges | 6,049,216 A | 4/2000 | Yang et al. |
| 5,831,442 A | 11/1998 | Heigl | 6,049,976 A | 4/2000 | Khandros |
| 5,832,601 A | 11/1998 | Eldridge et al. | 6,050,829 A | 4/2000 | Eldridge et al. |
| 5,833,601 A | 11/1998 | Swartz et al. | 6,051,422 A | 4/2000 | Kovacs et al. |
| 5,838,160 A | 11/1998 | Beaman et al. | 6,052,653 A | 4/2000 | Mazur et al. |
| 5,841,288 A | 11/1998 | Meaney et al. | 6,054,651 A | 4/2000 | Fogel et al. |
| 5,846,708 A | 12/1998 | Hollis et al. | 6,054,869 A | 4/2000 | Hutton et al. |
| 5,847,569 A | 12/1998 | Ho et al. | 6,059,982 A | 5/2000 | Palagonia et al. |
| 5,848,500 A | 12/1998 | Kirk | 6,060,888 A | 5/2000 | Blackham et al. |
| 5,852,232 A | 12/1998 | Samsavar et al. | 6,060,892 A | 5/2000 | Yamagata |
| 5,854,608 A | 12/1998 | Leisten | 6,061,589 A | 5/2000 | Bridges et al. |
| 5,864,946 A | 2/1999 | Eldridge et al. | 6,062,879 A | 5/2000 | Beaman et al. |
| 5,867,073 A | 2/1999 | Weinreb et al. | 6,064,213 A | 5/2000 | Khandros et al. |
| 5,869,326 A | 2/1999 | Hofmann | 6,064,217 A | 5/2000 | Smith |
| 5,869,974 A | 2/1999 | Akram et al. | 6,064,218 A | 5/2000 | Godfrey et al. |
| 5,874,361 A | 2/1999 | Collins et al. | 6,066,911 A | 5/2000 | Lindemann et al. |
| 5,876,082 A | 3/1999 | Kempf et al. | 6,078,183 A | 6/2000 | Cole, Jr. |
| 5,878,486 A | 3/1999 | Eldridge et al. | 6,078,500 A | 6/2000 | Beaman et al. |
| 5,883,522 A | 3/1999 | O'Boyle | 6,090,261 A | 7/2000 | Mathieu |
| 5,883,523 A | 3/1999 | Ferland et al. | 6,091,236 A | 7/2000 | Piety et al. |
| 5,884,398 A | 3/1999 | Eldridge et al. | 6,091,255 A | 7/2000 | Godfrey |
| 5,888,075 A | 3/1999 | Hasegawa et al. | 6,096,567 A | 8/2000 | Kaplan et al. |
| 5,892,539 A | 4/1999 | Colvin | 6,100,815 A | 8/2000 | Pailthorp |
| 5,896,038 A | 4/1999 | Budnaitis et al. | 6,104,201 A | 8/2000 | Beaman et al. |
| 5,900,737 A | 5/1999 | Graham et al. | 6,104,206 A | 8/2000 | Verkuil |
| 5,900,738 A | 5/1999 | Khandros et al. | 6,110,823 A | 8/2000 | Eldridge et al. |
| 5,903,143 A | 5/1999 | Mochizuki et al. | 6,114,864 A | 9/2000 | Soejima et al. |
| 5,905,421 A | 5/1999 | Oldfield | 6,114,865 A | 9/2000 | Lagowski et al. |

| | | | |
|---|---|---|---|
| 6,118,287 A | 9/2000 | Boll et al. | |
| 6,118,894 A | 9/2000 | Schwartz et al. | |
| 6,124,725 A | 9/2000 | Sato | |
| 6,127,831 A | 10/2000 | Khoury et al. | |
| 6,137,302 A | 10/2000 | Schwindt | |
| 6,144,212 A | 11/2000 | Mizuta | |
| 6,147,502 A | 11/2000 | Fryer et al. | |
| 6,147,851 A | 11/2000 | Anderson | |
| 6,150,186 A | 11/2000 | Chen et al. | |
| 6,160,407 A | 12/2000 | Nikawa | |
| 6,160,412 A | 12/2000 | Martel et al. | |
| 6,166,333 A | 12/2000 | Crumly et al. | |
| 6,166,553 A | 12/2000 | Sinsheimer | |
| 6,168,974 B1 | 1/2001 | Chang et al. | |
| 6,169,410 B1 | 1/2001 | Grace et al. | |
| 6,172,337 B1 | 1/2001 | Johnsgard et al. | |
| 6,174,744 B1 | 1/2001 | Watanabe et al. | |
| 6,175,228 B1 | 1/2001 | Zamborelli et al. | |
| 6,181,144 B1 | 1/2001 | Hembree et al. | |
| 6,181,149 B1 | 1/2001 | Godfrey et al. | |
| 6,181,297 B1 | 1/2001 | Leisten | |
| 6,181,416 B1 | 1/2001 | Falk | |
| 6,184,053 B1 | 2/2001 | Eldridge et al. | |
| 6,184,587 B1 | 2/2001 | Khandros et al. | |
| 6,184,845 B1 | 2/2001 | Leisten et al. | |
| 6,191,596 B1 | 2/2001 | Abiko | |
| 6,194,720 B1 | 2/2001 | Li et al. | |
| 6,206,273 B1 | 3/2001 | Beaman et al. | |
| 6,208,225 B1 | 3/2001 | Miller | |
| 6,211,663 B1 | 4/2001 | Moulthrop et al. | |
| 6,211,837 B1 | 4/2001 | Crouch et al. | |
| 6,215,196 B1 | 4/2001 | Eldridge et al. | |
| 6,215,295 B1 | 4/2001 | Smith, III | |
| 6,215,670 B1 | 4/2001 | Khandros | |
| 6,218,910 B1 | 4/2001 | Miller | |
| 6,222,031 B1 | 4/2001 | Wakabayashi et al. | |
| 6,229,327 B1 | 5/2001 | Boll et al. | |
| 6,232,149 B1 | 5/2001 | Dozier, II et al. | |
| 6,232,787 B1 | 5/2001 | Lo et al. | |
| 6,232,788 B1 | 5/2001 | Schwindt et al. | |
| 6,233,613 B1 | 5/2001 | Walker et al. | |
| 6,236,223 B1 | 5/2001 | Brady et al. | |
| 6,242,803 B1 | 6/2001 | Khandros et al. | |
| 6,242,929 B1 | 6/2001 | Mizuta | |
| 6,245,692 B1 | 6/2001 | Pearce et al. | |
| 6,246,247 B1 | 6/2001 | Eldridge et al. | |
| 6,251,595 B1 | 6/2001 | Gordon et al. | |
| 6,255,126 B1 | 7/2001 | Mathieu et al. | |
| 6,256,882 B1 * | 7/2001 | Gleason et al. | 29/874 |
| 6,257,564 B1 | 7/2001 | Avneri et al. | |
| 6,265,950 B1 | 7/2001 | Schmidt et al. | |
| 6,268,015 B1 | 7/2001 | Mathieu et al. | |
| 6,268,016 B1 | 7/2001 | Bhatt et al. | |
| 6,271,673 B1 | 8/2001 | Furuta et al. | |
| 6,274,823 B1 | 8/2001 | Khandros et al. | |
| 6,275,738 B1 | 8/2001 | Kasevich et al. | |
| 6,278,051 B1 | 8/2001 | Peabody | |
| 6,278,411 B1 | 8/2001 | Ohlsson et al. | |
| 6,281,691 B1 | 8/2001 | Matsunaga et al. | |
| 6,286,208 B1 | 9/2001 | Shih et al. | |
| 6,292,760 B1 | 9/2001 | Burns | |
| 6,295,729 B1 | 10/2001 | Beaman et al. | |
| 6,300,775 B1 | 10/2001 | Peach et al. | |
| 6,300,780 B1 | 10/2001 | Beaman et al. | |
| 6,307,161 B1 | 10/2001 | Grube et al. | |
| 6,307,387 B1 | 10/2001 | Gleason et al. | |
| 6,307,672 B1 | 10/2001 | DeNure | |
| 6,310,483 B1 | 10/2001 | Taura et al. | |
| 6,320,372 B1 | 11/2001 | Keller | |
| 6,320,396 B1 | 11/2001 | Nikawa | |
| 6,327,034 B1 | 12/2001 | Hoover et al. | |
| 6,329,827 B1 | 12/2001 | Beaman et al. | |
| 6,330,164 B1 | 12/2001 | Khandros et al. | |
| 6,332,270 B2 | 12/2001 | Beaman et al. | |
| 6,334,247 B1 | 1/2002 | Beaman et al. | |
| 6,335,625 B1 | 1/2002 | Bryant et al. | |
| 6,339,338 B1 | 1/2002 | Eldridge et al. | |
| 6,340,568 B2 | 1/2002 | Hefti | |
| 6,340,895 B1 | 1/2002 | Uher et al. | |
| 6,351,885 B2 | 3/2002 | Suzuki et al. | |
| 6,352,454 B1 | 3/2002 | Kim et al. | |
| 6,359,456 B1 | 3/2002 | Hembree et al. | |
| 6,362,792 B1 | 3/2002 | Sawamura et al. | |
| 6,366,247 B1 | 4/2002 | Sawamura et al. | |
| 6,369,776 B1 | 4/2002 | Leisten et al. | |
| 6,376,258 B2 | 4/2002 | Hefti | |
| 6,384,614 B1 | 5/2002 | Hager et al. | |
| 6,395,480 B1 | 5/2002 | Hefti | |
| 6,396,296 B1 | 5/2002 | Tartar et al. | |
| 6,396,298 B1 | 5/2002 | Young et al. | |
| 6,400,168 B2 | 6/2002 | Matsunaga et al. | |
| 6,404,211 B2 | 6/2002 | Hamel et al. | |
| 6,404,213 B2 | 6/2002 | Noda | |
| 6,407,562 B1 | 6/2002 | Whiteman | |
| 6,409,724 B1 | 6/2002 | Penny et al. | |
| 6,414,478 B1 | 7/2002 | Suzuki | |
| 6,415,858 B1 | 7/2002 | Getchel et al. | |
| 6,418,009 B1 | 7/2002 | Brunette | |
| 6,419,500 B1 | 7/2002 | Kister | |
| 6,420,722 B2 | 7/2002 | Moore et al. | |
| 6,420,887 B1 | 7/2002 | Kister et al. | |
| 6,424,164 B1 | 7/2002 | Kister | |
| 6,424,316 B1 | 7/2002 | Leisten et al. | |
| 6,429,029 B1 | 8/2002 | Eldridge et al. | |
| 6,441,315 B1 | 8/2002 | Eldridge et al. | |
| 6,442,831 B1 | 9/2002 | Khandros et al. | |
| 6,447,339 B1 | 9/2002 | Reed et al. | |
| 6,448,788 B1 | 9/2002 | Meaney et al. | |
| 6,448,865 B1 | 9/2002 | Miller | |
| 6,452,406 B1 | 9/2002 | Beaman et al. | |
| 6,452,411 B1 | 9/2002 | Miller et al. | |
| 6,456,099 B1 | 9/2002 | Eldridge et al. | |
| 6,456,103 B1 | 9/2002 | Eldridge et al. | |
| 6,459,343 B1 | 10/2002 | Miller | |
| 6,459,739 B1 | 10/2002 | Vitenberg | |
| 6,468,098 B1 | 10/2002 | Eldridge | |
| 6,475,822 B2 | 11/2002 | Eldridge et al. | |
| 6,476,333 B1 | 11/2002 | Khandros et al. | |
| 6,476,442 B1 | 11/2002 | Williams et al. | |
| 6,476,630 B1 | 11/2002 | Whitten et al. | |
| 6,479,308 B1 | 11/2002 | Eldridge | |
| 6,480,013 B1 | 11/2002 | Nayler et al. | |
| 6,480,978 B1 | 11/2002 | Roy et al. | |
| 6,481,939 B1 | 11/2002 | Gillespie et al. | |
| 6,482,013 B2 | 11/2002 | Eldridge et al. | |
| 6,483,327 B1 | 11/2002 | Bruce et al. | |
| 6,488,405 B1 | 12/2002 | Eppes et al. | |
| 6,490,471 B2 | 12/2002 | Svenson et al. | |
| 6,491,968 B1 | 12/2002 | Mathieu et al. | |
| 6,499,121 B1 | 12/2002 | Roy et al. | |
| 6,501,343 B2 | 12/2002 | Miller | |
| 6,509,751 B1 | 1/2003 | Mathieu | |
| 6,512,482 B1 | 1/2003 | Nelson et al. | |
| 6,520,778 B1 | 2/2003 | Eldridge et al. | |
| 6,525,552 B2 | 2/2003 | Kister | |
| 6,525,555 B1 | 2/2003 | Khandros et al. | |
| 6,526,655 B2 | 3/2003 | Beaman et al. | |
| 6,528,984 B2 | 3/2003 | Beaman et al. | |
| 6,528,993 B1 | 3/2003 | Shin et al. | |
| 6,529,844 B1 | 3/2003 | Kapetanic et al. | |
| 6,530,148 B1 | 3/2003 | Kister | |
| 6,534,856 B1 | 3/2003 | Dozier, II et al. | |
| 6,538,214 B2 | 3/2003 | Khandros | |
| 6,538,538 B2 | 3/2003 | Hreish et al. | |
| 6,539,531 B2 | 3/2003 | Miller et al. | |
| 6,548,311 B1 | 4/2003 | Knoll | |

| | | |
|---|---|---|
| 6,549,022 B1 | 4/2003 | Cole, Jr. et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |
| 6,573,702 B2 | 6/2003 | Marcuse et al. |
| 6,578,264 B1 * | 6/2003 | Gleason et al. ............... 29/874 |
| 6,580,283 B1 | 6/2003 | Carbone et al. |
| 6,582,979 B2 | 6/2003 | Coccioli et al. |
| 6,586,956 B2 | 7/2003 | Aldaz et al. |
| 6,587,327 B1 | 7/2003 | Devoe et al. |
| 6,597,187 B2 | 7/2003 | Eldridge et al. |
| 6,603,322 B1 | 8/2003 | Boll et al. |
| 6,603,323 B1 | 8/2003 | Miller et al. |
| 6,603,324 B2 | 8/2003 | Eldridge et al. |
| 6,605,951 B1 | 8/2003 | Cowan |
| 6,605,955 B1 | 8/2003 | Costello et al. |
| 6,606,014 B2 | 8/2003 | Miller |
| 6,606,575 B2 | 8/2003 | Miller |
| 6,608,494 B1 | 8/2003 | Bruce et al. |
| 6,611,417 B2 | 8/2003 | Chen |
| 6,615,485 B2 | 9/2003 | Eldridge et al. |
| 6,616,966 B2 | 9/2003 | Mathieu et al. |
| 6,617,862 B1 | 9/2003 | Bruce |
| 6,621,082 B2 | 9/2003 | Morita et al. |
| 6,621,260 B2 | 9/2003 | Eldridge et al. |
| 6,622,103 B1 | 9/2003 | Miller |
| 6,624,648 B2 | 9/2003 | Eldridge et al. |
| 6,627,461 B2 | 9/2003 | Chapman et al. |
| 6,627,483 B2 | 9/2003 | Ondricek et al. |
| 6,627,980 B2 | 9/2003 | Eldridge |
| 6,628,503 B2 | 9/2003 | Sogard |
| 6,628,980 B2 | 9/2003 | Atalar et al. |
| 6,633,174 B1 | 10/2003 | Satya et al. |
| 6,636,182 B2 | 10/2003 | Mehltretter |
| 6,639,461 B1 | 10/2003 | Tam et al. |
| 6,640,415 B2 | 11/2003 | Eslamy et al. |
| 6,640,432 B1 | 11/2003 | Mathieu et al. |
| 6,642,625 B2 | 11/2003 | Dozier, II et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |
| 6,685,817 B1 | 2/2004 | Mathieu |
| 6,686,754 B2 | 2/2004 | Miller |
| 6,690,185 B1 | 2/2004 | Khandros et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,386 B2 | 3/2004 | Gleason et al. |
| 6,708,403 B2 | 3/2004 | Beaman et al. |
| 6,710,798 B1 | 3/2004 | Hershel et al. |
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,764,869 B2 | 7/2004 | Eldridge |
| 6,768,328 B2 | 7/2004 | Self et al. |
| 6,770,955 B1 | 8/2004 | Coccioli et al. |
| 6,771,806 B1 | 8/2004 | Satya et al. |
| 6,777,319 B2 | 8/2004 | Grube et al. |
| 6,778,140 B2 | 8/2004 | Yeh |
| 6,778,406 B2 | 8/2004 | Eldridge et al. |
| 6,780,001 B2 | 8/2004 | Eldridge et al. |
| 6,784,674 B2 | 8/2004 | Miller |
| 6,784,677 B2 | 8/2004 | Miller et al. |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,794,888 B2 | 9/2004 | Kawaguchi et al. |
| 6,794,950 B2 | 9/2004 | Du Toit et al. |
| 6,798,225 B2 | 9/2004 | Miller |
| 6,798,226 B2 | 9/2004 | Altmann et al. |
| 6,806,724 B2 | 10/2004 | Hayden et al. |
| 6,806,836 B2 | 10/2004 | Ogawa et al. |
| 6,807,734 B2 * | 10/2004 | Eldridge et al. ............... 29/874 |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,825,677 B2 * | 11/2004 | Gleason et al. ............. 324/754 |
| 6,827,584 B2 | 12/2004 | Mathieu et al. |
| 6,835,898 B2 | 12/2004 | Eldridge et al. |
| 6,836,962 B2 | 1/2005 | Khandros et al. |
| 6,838,885 B2 | 1/2005 | Kamitani |
| 6,838,890 B2 | 1/2005 | Tervo et al. |
| 6,839,964 B2 | 1/2005 | Henson |
| 6,845,491 B2 | 1/2005 | Miller et al. |
| 6,856,129 B2 | 2/2005 | Thomas et al. |
| 6,856,150 B2 | 2/2005 | Sporck et al. |
| 6,860,009 B2 * | 3/2005 | Gleason et al. ............... 29/874 |
| 6,862,727 B2 | 3/2005 | Stevens |
| 6,864,105 B2 | 3/2005 | Grube et al. |
| 6,864,694 B2 | 3/2005 | McTigue |
| 6,870,381 B2 | 3/2005 | Grube |
| 6,882,239 B2 | 4/2005 | Miller |
| 6,882,546 B2 | 4/2005 | Miller |
| 6,887,723 B1 | 5/2005 | Ondricek et al. |
| 6,888,362 B2 | 5/2005 | Eldridge et al. |
| 6,891,385 B2 | 5/2005 | Miller |
| 6,900,646 B2 | 5/2005 | Kasukabe et al. |
| 6,900,647 B2 | 5/2005 | Mazur |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |

| | | |
|---|---|---|
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,911,814 B2 | 6/2005 | Miller et al. |
| 6,911,826 B2 | 6/2005 | Plotnikov et al. |
| 6,911,834 B2 | 6/2005 | Mitchell et al. |
| 6,911,835 B2 | 6/2005 | Chraft et al. |
| 6,912,468 B2 | 6/2005 | Marin et al. |
| 6,913,468 B2 | 7/2005 | Dozier, II et al. |
| 6,914,244 B2 | 7/2005 | Alani |
| 6,914,427 B2 | 7/2005 | Gifford et al. |
| 6,914,430 B2 | 7/2005 | Hasegawa et al. |
| 6,914,580 B2 | 7/2005 | Leisten |
| 6,917,195 B2 | 7/2005 | Hollman |
| 6,917,210 B2 | 7/2005 | Miller |
| 6,917,211 B2 | 7/2005 | Yoshida et al. |
| 6,917,525 B2 | 7/2005 | Mok et al. |
| 6,917,732 B2 | 7/2005 | Miyata et al. |
| 6,919,732 B2 | 7/2005 | Yoshida et al. |
| 6,922,069 B2 | 7/2005 | Jun |
| 6,924,653 B2 | 8/2005 | Schaeffer et al. |
| 6,924,655 B2 | 8/2005 | Kirby |
| 6,927,078 B2 | 8/2005 | Saijyo et al. |
| 6,927,079 B1 | 8/2005 | Fyfield |
| 6,927,586 B2 | 8/2005 | Thiessen |
| 6,927,587 B2 | 8/2005 | Yoshioka |
| 6,927,598 B2 | 8/2005 | Lee et al. |
| 6,930,498 B2 | 8/2005 | Tervo et al. |
| 6,933,713 B2 | 8/2005 | Cannon |
| 6,933,717 B1 | 8/2005 | Dogaru et al. |
| 6,933,725 B2 | 8/2005 | Lim et al. |
| 6,933,736 B2 | 8/2005 | Kobayashi et al. |
| 6,933,737 B2 | 8/2005 | Sugawara |
| 6,937,020 B2 | 8/2005 | Munson et al. |
| 6,937,037 B2 | 8/2005 | Eldridge et al. |
| 6,937,039 B2 | 8/2005 | Barr et al. |
| 6,937,040 B2 | 8/2005 | Maeda et al. |
| 6,937,042 B2 | 8/2005 | Yoshida et al. |
| 6,937,045 B2 | 8/2005 | Sinclair |
| 6,937,341 B1 | 8/2005 | Woollam et al. |
| 6,940,264 B2 | 9/2005 | Ryken, Jr. et al. |
| 6,940,283 B2 | 9/2005 | McQueeney |
| 6,943,563 B2 | 9/2005 | Martens |
| 6,943,571 B2 | 9/2005 | Worledge |
| 6,943,574 B2 | 9/2005 | Actmann et al. |
| 6,944,380 B1 | 9/2005 | Hideo et al. |
| 6,946,375 B2 | 9/2005 | Hattori et al. |
| 6,946,859 B2 | 9/2005 | Karavakis et al. |
| 6,946,860 B2 | 9/2005 | Cheng |
| 6,948,391 B2 | 9/2005 | Brassell et al. |
| 6,948,981 B2 | 9/2005 | Pade |
| 6,970,001 B2 | 11/2005 | Chheda et al. |
| 6,987,483 B2 | 1/2006 | Tran |
| 7,001,785 B1 | 2/2006 | Chen |
| 7,002,133 B2 | 2/2006 | Beausoleil et al. |
| 7,002,363 B2 | 2/2006 | Mathieu |
| 7,002,364 B2 | 2/2006 | Kang et al. |
| 7,003,184 B2 | 2/2006 | Ronnekliev et al. |
| 7,005,842 B2 | 2/2006 | Fink et al. |
| 7,005,868 B2 | 2/2006 | McTigue |
| 7,005,879 B1 | 2/2006 | Robertazzi |
| 7,006,046 B2 | 2/2006 | Aisenbrey |
| 7,007,380 B2 | 3/2006 | Das et al. |
| 7,009,188 B2 | 3/2006 | Wang |
| 7,009,383 B2 | 3/2006 | Harwood et al. |
| 7,009,415 B2 | 3/2006 | Kobayashi et al. |
| 7,011,531 B2 | 3/2006 | Egitto et al. |
| 7,012,425 B2 | 3/2006 | Shoji |
| 7,012,441 B2 | 3/2006 | Chou et al. |
| 7,013,221 B1 | 3/2006 | Friend et al. |
| 7,014,499 B2 | 3/2006 | Yoon |
| 7,015,455 B2 | 3/2006 | Mitsuoka et al. |
| 7,015,689 B2 | 3/2006 | Kasajima et al. |
| 7,015,690 B2 | 3/2006 | Wang et al. |
| 7,015,703 B2 | 3/2006 | Hopkins et al. |
| 7,015,707 B2 | 3/2006 | Cherian |
| 7,015,708 B2 | 3/2006 | Beckous et al. |
| 7,015,709 B2 | 3/2006 | Capps et al. |
| 7,015,710 B2 | 3/2006 | Yoshida et al. |
| 7,015,711 B2 | 3/2006 | Rothaug et al. |
| 7,019,541 B2 | 3/2006 | Kittrell |
| 7,019,544 B1 | 3/2006 | Jacobs et al. |
| 7,019,701 B2 | 3/2006 | Ohno et al. |
| 7,020,360 B2 | 3/2006 | Satomura et al. |
| 7,020,363 B2 | 3/2006 | Johannessen |
| 7,022,976 B1 | 4/2006 | Santana, Jr. et al. |
| 7,022,985 B2 | 4/2006 | Knebel et al. |
| 7,023,225 B2 | 4/2006 | Blackwood |
| 7,023,226 B2 | 4/2006 | Okumura et al. |
| 7,023,231 B2 | 4/2006 | Howland, Jr. et al. |
| 7,025,628 B2 | 4/2006 | LaMeres et al. |
| 7,026,832 B2 | 4/2006 | Chaya et al. |
| 7,026,833 B2 | 4/2006 | Rincon et al. |
| 7,026,834 B2 | 4/2006 | Hwang |
| 7,026,835 B2 | 4/2006 | Farnworth et al. |
| 7,030,599 B2 | 4/2006 | Douglas |
| 7,030,827 B2 | 4/2006 | Mahler et al. |
| 7,032,307 B2 | 4/2006 | Matsunaga et al. |
| 7,034,553 B2 | 4/2006 | Gilboe |
| 7,035,738 B2 | 4/2006 | Matsumoto et al. |
| 7,088,981 B2 | 8/2006 | Chang |
| 7,096,133 B1 | 8/2006 | Martin et al. |
| 7,148,711 B2 | 12/2006 | Tervo et al. |
| 7,178,236 B2 * | 2/2007 | Gleason et al. ............... 29/874 |
| 7,187,188 B2 | 3/2007 | Andrews et al. |
| 7,188,037 B2 | 3/2007 | Hidehira |
| 7,368,927 B2 | 5/2008 | Smith et al. |
| 2001/0002794 A1 | 6/2001 | Draving et al. |
| 2001/0009061 A1 | 7/2001 | Gleason et al. |
| 2001/0009377 A1 | 7/2001 | Schwindt et al. |
| 2001/0010468 A1 * | 8/2001 | Gleason et al. ............ 324/715 |
| 2001/0020283 A1 | 9/2001 | Sakaguchi |
| 2001/0024116 A1 | 9/2001 | Draving |
| 2001/0030549 A1 | 10/2001 | Gleason et al. |
| 2001/0043073 A1 | 11/2001 | Montoya |
| 2001/0044152 A1 | 11/2001 | Burnett |
| 2001/0045511 A1 | 11/2001 | Moore et al. |
| 2001/0054906 A1 | 12/2001 | Fujimura |
| 2002/0005728 A1 | 1/2002 | Babson et al. |
| 2002/0008533 A1 | 1/2002 | Ito et al. |
| 2002/0009377 A1 | 1/2002 | Shafer |
| 2002/0009378 A1 | 1/2002 | Obara |
| 2002/0011859 A1 | 1/2002 | Smith et al. |
| 2002/0011863 A1 | 1/2002 | Takahashi et al. |
| 2002/0050828 A1 | 5/2002 | Seward, IV et al. |
| 2002/0070743 A1 | 6/2002 | Felici et al. |
| 2002/0070745 A1 | 6/2002 | Johnson et al. |
| 2002/0079911 A1 | 6/2002 | Schwindt |
| 2002/0109514 A1 | 8/2002 | Brandorff et al. |
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0180466 A1 | 12/2002 | Hiramatsu et al. |
| 2002/0197709 A1 | 12/2002 | Van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0057957 A1 | 3/2003 | McQuade et al. |

| | | | | | | |
|---|---|---|---|---|---|---|
| 2003/0062915 A1 | 4/2003 | Arnold et al. | JP | 55-115383 | 9/1980 | |
| 2003/0072549 A1 | 4/2003 | Facer et al. | JP | 56-007439 | 1/1981 | |
| 2003/0077649 A1 | 4/2003 | Cho et al. | JP | 56-88333 | 7/1981 | |
| 2003/0088180 A1 | 5/2003 | VanVeen et al. | JP | 57-075480 | 5/1982 | |
| 2003/0119057 A1 | 6/2003 | Gascoyne et al. | JP | 57-163035 | 10/1982 | |
| 2003/0139662 A1 | 7/2003 | Seidman | JP | 62-11243 | 1/1987 | |
| 2003/0139790 A1 | 7/2003 | Ingle et al. | JP | 62-51235 | 3/1987 | |
| 2003/0155939 A1 | 8/2003 | Lutz et al. | JP | 62-098634 | 5/1987 | |
| 2003/0170898 A1 | 9/2003 | Gunderson et al. | JP | 62-107937 | 5/1987 | |
| 2003/0184332 A1 | 10/2003 | Tomimatsu et al. | JP | 62-239050 | 10/1987 | |
| 2004/0015060 A1 | 1/2004 | Samsoondar et al. | JP | 62239050 | 10/1987 | |
| 2004/0021475 A1 | 2/2004 | Ito et al. | JP | 63-108736 | 5/1988 | |
| 2004/0061514 A1 | 4/2004 | Schwindt et al. | JP | 63-129640 | 6/1988 | |
| 2004/0066181 A1 | 4/2004 | Thies | JP | 63-143814 | 6/1988 | |
| 2004/0069776 A1 | 4/2004 | Fagrell et al. | JP | 63-318745 | 12/1988 | |
| 2004/0090223 A1 | 5/2004 | Yonezawa | JP | 1-165968 | 6/1989 | |
| 2004/0095145 A1 | 5/2004 | Boudiaf et al. | JP | 1-214038 | 8/1989 | |
| 2004/0095641 A1 | 5/2004 | Russum et al. | JP | 1-219575 | 9/1989 | |
| 2004/0100276 A1 | 5/2004 | Fanton | JP | 1-296167 | 11/1989 | |
| 2004/0100297 A1 | 5/2004 | Tanioka et al. | JP | 2-22836 | 1/1990 | |
| 2004/0108847 A1 | 6/2004 | Stoll et al. | JP | 2-124469 | 5/1990 | |
| 2004/0113640 A1 | 6/2004 | Cooper et al. | JP | 2129393 | 5/1990 | |
| 2004/0124861 A1 | 7/2004 | Zaerpoor | JP | 2-191352 | 7/1990 | |
| 2004/0130787 A1 | 7/2004 | Thome-Forster et al. | JP | 3-175367 | 7/1991 | |
| 2004/0132222 A1 | 7/2004 | Hembree et al. | JP | 3-196206 | 8/1991 | |
| 2004/0134899 A1 | 7/2004 | Hiramatsu et al. | JP | 3-228348 | 10/1991 | |
| 2004/0147034 A1 | 7/2004 | Gore et al. | JP | 4-130639 | 5/1992 | |
| 2004/0162689 A1 | 8/2004 | Jamneala et al. | JP | 4-159043 | 6/1992 | |
| 2004/0175294 A1 | 9/2004 | Ellison et al. | JP | 4165361 | 6/1992 | |
| 2004/0186382 A1 | 9/2004 | Modell et al. | JP | 4-206930 | 7/1992 | |
| 2004/0193382 A1 | 9/2004 | Adamian et al. | JP | 4-340248 | 11/1992 | |
| 2004/0197771 A1 | 10/2004 | Powers et al. | JP | 5-082631 | 4/1993 | |
| 2004/0199350 A1 | 10/2004 | Blackham et al. | JP | 51-57790 | 6/1993 | |
| 2004/0207072 A1 | 10/2004 | Hiramatsu et al. | JP | 51-66893 | 7/1993 | |
| 2004/0207424 A1 | 10/2004 | Hollman | JP | 6-85044 | 3/1994 | |
| 2004/0239338 A1 | 12/2004 | Johnsson et al. | JP | 60-71425 | 3/1994 | |
| 2004/0246004 A1 | 12/2004 | Heuermann | JP | 6-102313 | 4/1994 | |
| 2004/0251922 A1 | 12/2004 | Martens et al. | JP | 6-132709 | 5/1994 | |
| 2005/0024069 A1 | 2/2005 | Hayden et al. | JP | 7-005078 | 1/1995 | |
| 2005/0026276 A1 | 2/2005 | Chou | JP | 7-12871 | 1/1995 | |
| 2005/0030047 A1 | 2/2005 | Adamian | JP | 7012871 | 1/1995 | |
| 2005/0054029 A1 | 3/2005 | Tomimatsu et al. | JP | 8-35987 | 2/1996 | |
| 2005/0062533 A1 | 3/2005 | Vice | JP | 8-261898 | 10/1996 | |
| 2005/0083130 A1 | 4/2005 | Grilo | JP | 8-330401 | 12/1996 | |
| 2005/0101846 A1 | 5/2005 | Fine et al. | JP | 10-116866 | 5/1998 | |
| 2005/0156675 A1 | 7/2005 | Rohde et al. | JP | 11-4001 | 1/1999 | |
| 2005/0164160 A1 | 7/2005 | Gunter et al. | JP | 11-023975 | 1/1999 | |
| 2005/0165316 A1 | 7/2005 | Lowery et al. | JP | 2000-329664 | 11/2000 | |
| 2005/0168722 A1 | 8/2005 | Forstner et al. | JP | 2001-124676 | 5/2001 | |
| 2005/0174191 A1 | 8/2005 | Brunker et al. | JP | 2001-189285 | 7/2001 | |
| 2005/0178980 A1 | 8/2005 | Skidmore et al. | JP | 2001-189378 | 7/2001 | |
| 2005/0195124 A1 | 9/2005 | Puente Baliarda et al. | JP | 2002-203879 | 7/2002 | |
| 2005/0236587 A1 | 10/2005 | Kodama et al. | JP | 2002-243502 | 8/2002 | |
| 2005/0237102 A1 | 10/2005 | Tanaka | SU | 843040 | 6/1981 | |
| 2006/0052075 A1 | 3/2006 | Galivanche et al. | SU | 1392603 | 4/1988 | |
| 2006/0155270 A1 | 7/2006 | Hancock et al. | WO | WO98/07040 | 2/1998 | |
| 2006/0226864 A1 | 10/2006 | Kramer | WO | WO 00/73905 | * 12/2000 | |
| 2007/0024506 A1 | 2/2007 | Hardacker | WO | WO01/07207 | 2/2001 | |
| 2007/0030021 A1 | 2/2007 | Cowan et al. | WO | WO 01/69656 | 9/2001 | |
| | | | WO | WO 2004/065944 | 8/2004 | |
| | | | WO | WO 2004/079299 | 9/2004 | |

FOREIGN PATENT DOCUMENTS

| | | |
|---|---|---|
| DE | 3637549 | 5/1988 |
| DE | 4223658 | 1/1993 |
| DE | 19522774 | 1/1997 |
| DE | 10000324 | 7/2001 |
| EP | 0230348 | 7/1987 |
| EP | 0259163 | 3/1988 |
| EP | 0304868 | 3/1989 |
| EP | 0 945 736 | 9/1999 |
| EP | 0945736 | 9/1999 |
| JP | 53-037077 | 4/1978 |
| JP | 53-052354 | 5/1978 |
| WO | WO 2005/062025 | 7/2005 |

OTHER PUBLICATIONS

Kim, Young-Dae, et. al., "Fabrication of a Silicon Micro-Probe for Vertical Probe Card Application," Japanese Journal of Applied Physics, vol. 37, pp. 7070-7073, 1998.

Basu, Saswata, et. al., "A Membrane Quadrant Probe for R&D Applications," Cascade Microtech, Inc., three pages.

Cascade Microtech, Inc., "Information Sheet for Pyramid Probe," 5 pages, Copyright 2001.

Mark S. Boguski and Martin W. McIntosh, "Biomedical informatics for proteomics," insight: review article, Nature 422, 233-237 (2003); doi:10.1038/nature01515.

Daniel Vanderweide, "THz Frequency Science & Technology Biomolecular Interaction Sensing with Sub-Terahertz Fields," University of Wisconsin-Madison, 2 pages, date unknown.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor: "Nature insight Proteomics," Nature vol. 422, Mar. 13, 2003 pp. 191-194.

Eric Phizicky, Philipe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

J. Martens, "Multiport SOLR Calibrations: Performance and an Analysis of Some Standards Dependencies," pp. 205-213, Anritsu Company, 490 Jarvis Drive, Morgan Hill, CA 95037, jmartens@anritsu.com.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 193-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for 1/f Noise Parameter Extraction," Agilent Technologies Comms EDA, 1400 Fountaingrove Pkw, Santa Rosa, CA 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Institute of Physics, pp. 1354-1356.

Cascade Microtech, "Probe Heads Care and cleaning of coaxial input microwave probes," Microwave Probe Care and Cleaning, Instruction Manual, Copyright 1990.

* cited by examiner

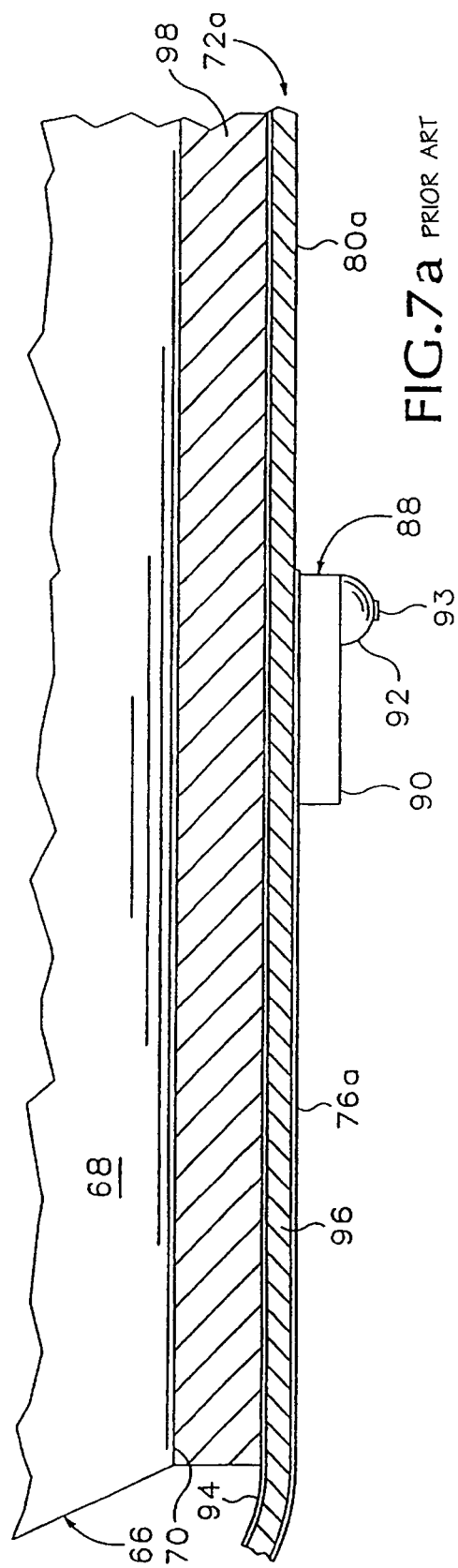
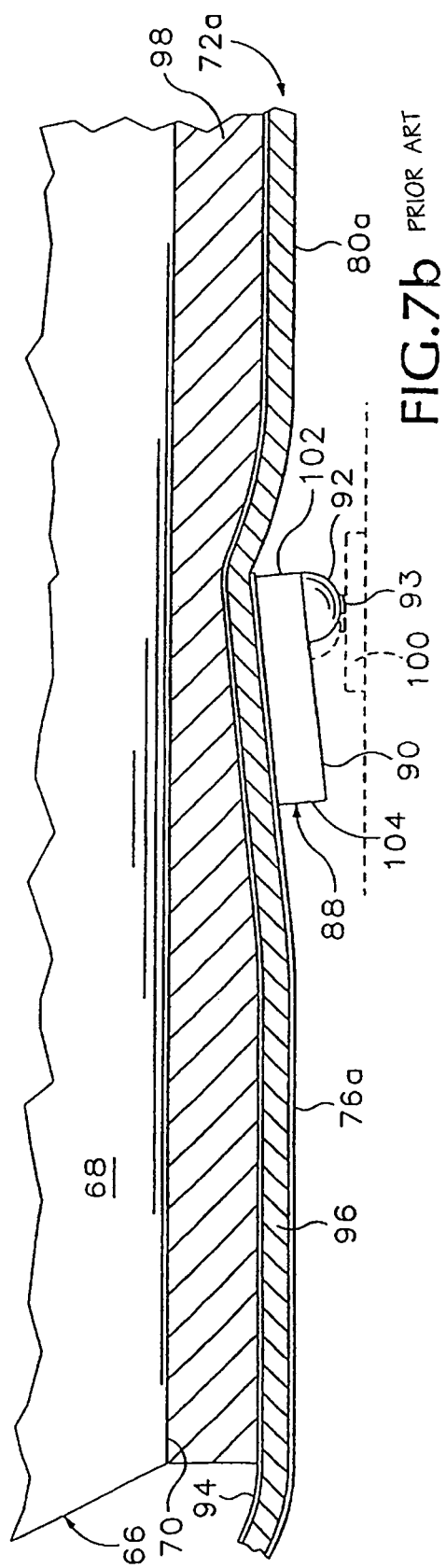
FIG.7a PRIOR ART
FIG.7b PRIOR ART

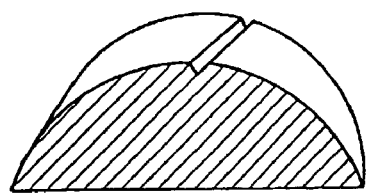
FIG. 27
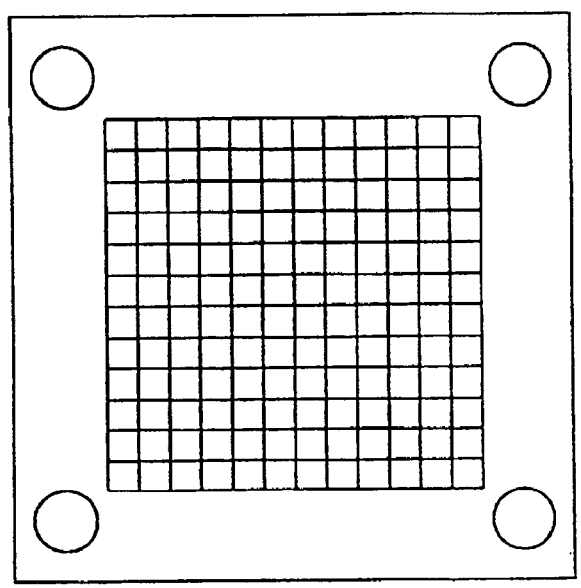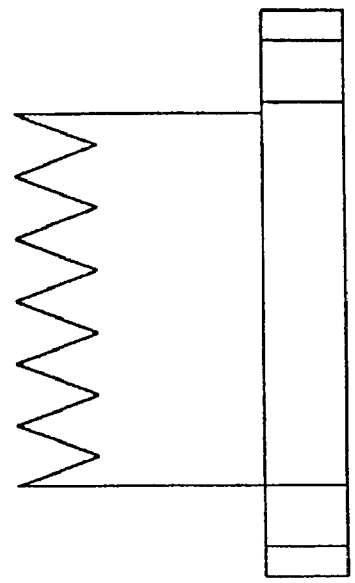
FIG. 28
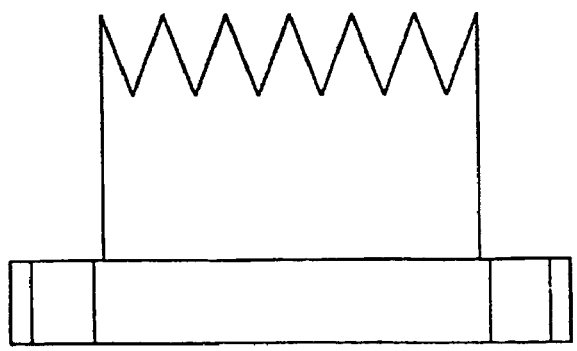

METHOD OF CONSTRUCTING A MEMBRANE PROBE

This application is a continuation of U.S. patent application Ser. No. 10/418,510, filed Apr. 16, 2003, now U.S. Pat. No. 7,178,236; which is a continuation of U.S. patent application Ser. No. 09/546,927, filed Apr. 11, 2000, now U.S. Pat. No. 6,578,264; which claims the benefit of U.S. Provisional App. No. 60/137,759, filed Jun. 4, 1999.

BACKGROUND OF THE INVENTION

The present invention relates to probe assemblies of the type commonly used for testing integrated circuits (IC) and, in particular, the present invention relates to a membrane probing assembly having contacts which scrub, in a locally controlled manner, across the respective input/output conductors of each device so as to reliably wipe clear the surface oxides that are normally found on those conductors thereby ensuring good electrical connection between the probing assembly and each device.

The trend in electronic production has been toward increasingly smaller geometries particularly in integrated circuit technology wherein a very large number of discrete circuit elements are fabricated on a single substrate or "wafer." After fabrication, this wafer is divided into a number of rectangular-shaped chips or "dice" where each die presents a rectangular or other regular arrangement of metallized contact pads through which input/output connections are made. Although each die is eventually packaged separately, for efficiency sake, testing of the circuit formed on each die is preferably performed while the dies are still joined together on the wafer. One typical procedure is to support the wafer on a flat stage or "chuck" and to move the wafer in X, Y and Z directions relative to the head of the probing assembly so that the contacts on the probing assembly move from die to die for consecutive engagement with each die. Respective signal, power and ground lines are run to the probing assembly from the test instrumentation thus enabling each circuit to be sequentially connected to the test instrumentation.

One conventional type of probing assembly used for testing integrated circuits provides contacts that are configured as needle-like tips. These tips are mounted about a central opening formed in a probe card so as to radially converge inwardly and downwardly through the opening. When the wafer is raised beyond that point where the pads on the wafer first come into contact with these tips, the tips flex upwardly so as to skate forwardly across their respective pads thereby removing oxide buildup on the pads.

The problem with this type of probing assembly is that the needle-like tips, due to their narrow geometry, exhibit high inductance so that signal distortion is large in high frequency measurements made through these tips. Also, these tips can act in the manner of a planing tool as they wipe across their respective pads, thereby leading to excessive pad damage. This problem is magnified to the extent that the probe tips bend out of shape during use or otherwise fail to terminate in a common plane which causes the more forward ones of the tips to bear down too heavily on their respective pads. Also, it is impractical to mount these tips at less than 100 micron center-to-center spacing or in a multi-row grid-like pattern so as to accommodate the pad arrangement of more modern, higher density dies. Also, this type of probing assembly has a scrub length of the needle tips of 25 microns or more, which increases the difficulty of staying within the allowed probing area.

In order to reduce inductive losses, decrease pad wear and accommodate smaller device geometries, a second type of probing assembly has been developed that uses a flexible membrane structure for supporting the probing contacts. In this assembly, lead lines of well-defined geometry are formed on one or more plies of flexible insulative film, such as polyimide or MYLAR™. If separate plies are used, these plies are bonded together to form, for example, a multilayered transmission line structure. In the central portion of this flexible structure or membrane, each conductive line is terminated by a respective probing contact which is formed on, and projects outwardly from, an outer face of the membrane. These probing contacts are arranged in a predetermined pattern that matches the pattern of the device pads and typically are formed as upraised bumps for probing the flat surfaces conventionally defined by the pads. The inner face of the membrane is supported on a supporting structure. This structure can take the form, for example, of a truncated pyramid, in which case the inner face of the center portion of the membrane is supported on the truncated end of the support while the marginal portions of the membrane are drawn away from the center portion at an angle thereto so as to clear any upright components that may surround the pads on the device.

With respect to the membrane probing assembly just described, excessive line inductance is eliminated by carefully selecting the geometry of the lead lines, and a photolithographic process is preferably used to enable some control over the size, spacing, and arrangement, of the probing contacts so as to accommodate higher density configurations. However, although several different forms of this probing assembly have been proposed, difficulties have been encountered in connection with this type of assembly in reducing pad wear and in achieving reliable clearing of the oxide layer from each of the device pads so as to ensure adequate electrical connection between the assembly and the device-under-test.

One conventional form of membrane probing assembly, for example, is exemplified by the device shown in Rath European Patent Pub. No. 259,163A2. This device has the central portion of the sheet-like membrane mounted directly against a rigid support. This rigid support, in turn, is connected by a resilient member comprising an elastomeric or rubber block to the main body of the assembly so that the membrane can tilt to match the tilt of the device. Huff U.S. Pat. No. 4,918,383 shows a closely related device wherein radially extending leaf springs permit vertical axis movement of the rigid support while preventing it from tilting so that there is no slippage or "misalignment" of the contact bumps on the pads and further so that the entire membrane will shift slightly in the horizontal plane to allow the contacts to "scrub" across their respective pads in order to clear surface oxides from these pads.

In respect to both of these devices, however, because of manufacturing tolerances, certain of the contact bumps are likely to be in a recessed position relative to their neighbors and these recessed bumps will not have a satisfactory opportunity to engage their pads since they will be drawn away from their pads by the action of their neighbors on the rigid support. Furthermore, even when "scrub" movement is provided in the manner of Huff, the contacts will tend to frictionally cling to the device as they perform the scrubbing movement, that is, there will be a tendency for the pads of the device to move in unison with the contacts so as to negate the effect of the contact movement. Whether any scrubbing action actually occurs depends on how far the pads can move, which depends, in turn, on the degree of lateral play that exists as a result of normal tolerance between the respective bearing surfaces of the probe head and chuck. Hence this form of membrane probing assembly does not ensure reliable electrical connection between each contact and pad.

A second conventional form of membrane probing assembly is exemplified by the device shown in Barsotti European Patent Pub. No. 304,868A2. This device provides a flexible backing for the central or contact-carrying portion of the flexible membrane. In Barsotti, the membrane is directly backed by an elastomeric member and this member, in turn, is backed by a rigid support so that minor height variations between the contacts or pads can be accommodated. It is also possible to use positive-pressure air, negative-pressure air, liquid or an unbacked elastomer to provide flexible backing for the membrane, as shown in Gangroth U.S. Pat. No. 4,649,339, Ardezzone U.S. Pat. No. 4,636,772, Reed, Jr. et al. U.S. Pat. No. 3,596,228 and Okubo et al. U.S. Pat. No. 5,134,365, respectively. These alternative devices, however, do not afford sufficient pressure between the probing contacts and the device pads to reliably penetrate the oxides that form on the pad surfaces.

In this second form of membrane probing assembly, as indicated in Okubo, the contacts may be limited to movement along the Z-axis in order to prevent slippage and resulting misalignment between the contacts and pads during engagement. Thus, in Barsotti, the rigid support underlying the elastomeric member is fixed in position although it is also possible to mount the support for Z-axis movement in the manner shown in Huff U.S. Pat. No. 4,980,637. Pad damage is likely to occur with this type of design, however, because a certain amount of tilt is typically present between the contacts and the device, and those contacts angled closest to the device will ordinarily develop much higher contact pressures than those which are angled away. The same problem arises with the related assembly shown in European Patent Pub. No. 230,348A2 to Garretson, even though in the Garretson device the characteristic of the elastomeric member is such as to urge the contacts into lateral movement when those contacts are placed into pressing engagement with their pads. Yet another related assembly is shown in Evans U.S. Pat. No. 4,975,638 which uses a pivotably mounted support for backing the elastomeric member so as to accommodate tilt between the contacts and the device. However, the Evans device is subject to the friction clinging problem already described insofar as the pads of the device are likely to cling to the contacts as the support pivots and causes the contacts to shift laterally.

Yet other forms of conventional membrane probing assemblies are shown in Crumly U.S. Pat. No. 5,395,253, Barsotti et al. U.S. Pat. No. 5,059,898 and Evans et al. U.S. Pat. No. 4,975,638. In Crumly, the center portion of a stretchable membrane is resiliently biased to a fully stretched condition using a spring. When the contacts engage their respective pads, the stretched center portion retracts against the spring to a partially relaxed condition so as to draw the contacts in radial scrub directions toward the center of the membrane. In Barsotti, each row of contacts is supported by the end of a respective L-shaped arm so that when the contacts in a row engage their respective pads, the corresponding arm flexes upwardly and causes the row of contacts to laterally scrub simultaneously across their respective pads. In both Crumly and Barsotti, however, if any tilt is present between the contacts and the device at the time of engagement, this tilt will cause the contacts angled closest to the device to scrub further than those angled further away. Moreover, the shorter contacts will be forced to move in their scrub directions before they have had the opportunity to engage their respective pads due to the controlling scrub action of their neighboring contacts. A further disadvantage of the Crumly device, in particular, is that the contacts nearer to the center of the membrane will scrub less than those nearer to the periphery so that scrub effectiveness will vary with contact position.

In Evans et al. U.S. Pat. No. 5,355,079 each contact constitutes a spring metal finger, and each finger is mounted so as to extend in a cantilevered manner away from the underlying membrane at a predetermined angle relative to the membrane. A similar configuration is shown in Higgins U.S. Pat. No. 5,521,518. It is difficult, however, to originally position these fingers so that they all terminate in a common plane, particularly if a high density pattern is required. Moreover, these fingers are easily bent out of position during use and cannot easily be rebent back to their original position. Hence, certain ones of the fingers are likely to touch down before other ones of the fingers, and scrub pressures and distances are likely to be different for different fingers. Nor, in Evans at least, is there an adequate mechanism for tolerating a minor degree of tilt between the fingers and pads. Although Evans suggests roughening the surface of each finger to improve the quality of electrical connection, this roughening can cause undue abrasion and damage to the pad surfaces. Yet a further disadvantage of the contact fingers shown in both Evans and Higgins is that such fingers are subject to fatigue and failure after a relatively low number of "touchdowns" or duty cycles due to repeated bending and stressing.

Referring to FIG. 1, Cascade Microtech, Inc. of Beaverton, Oreg. has developed a probe head 40 for mounting a membrane probing assembly 42. In order to measure the electrical performance of a particular die area 44 included on the silicon wafer 46, the high-speed digital lines 48 and/or shielded transmission lines 50 of the probe head are connected to the input/output ports of the test instrumentation by a suitable cable assembly, and the chuck 51 which supports the wafer is moved in mutually perpendicular X, Y, Z directions in order to bring the pads of the die area into pressing engagement with the contacts included on the lower contacting portion of the membrane probing assembly.

The probe head 40 includes a probe card 52 on which the data/signal lines 48 and 50 are arranged. Referring to FIGS. 2-3, the membrane probing assembly 42 includes a support element 54 formed of incompressible material such as a hard polymer. This element is detachably connected to the upper side of the probe card by four Allen screws 56 and corresponding nuts 58 (each screw passes through a respective attachment arm 60 of the support element, and a separate backing element 62 evenly distributes the clamping pressure of the screws over the entire back side of the supporting element). In accordance with this detachable connection, different probing assemblies having different contact arrangements can be quickly substituted for each other as needed for probing different devices.

Referring to FIGS. 3-4, the support element 54 includes a rearward base portion 64 to which the attachment arms 60 are integrally joined. Also included on the support element 54 is a forward support or plunger 66 that projects outwardly from the flat base portion. This forward support has angled sides 68 that converge toward a flat support surface 70 so as to give the forward support the shape of a truncated pyramid. Referring also to FIG. 2, a flexible membrane assembly 72 is attached to the support after being aligned by means of alignment pins 74 included on the base-portion. This flexible membrane assembly is formed by one or more plies of insulative sheeting such as KAPTON™ sold by E.I. Du Pont de Nemours or other polyimide film, and flexible conductive layers or strips are provided between or on these plies to form the data/signal lines 76.

When the support element 54 is mounted on the upper side of the probe card 52 as shown in FIG. 3, the forward support 66 protrudes through a central opening 78 in the probe card so as to present the contacts which are arranged on a central region 80 of the flexible membrane assembly in suitable position for pressing engagement with the pads of the device under test. Referring to FIG. 2, the membrane assembly includes radially extending arm segments 82 that are separated by inwardly curving edges 84 that give the assembly the shape of a formee cross, and these segments extend in an inclined manner along the angled sides 68 thereby clearing any upright components surrounding the pads. A series of contact pads 86 terminate the data/signal lines 76 so that when the support element is mounted, these pads electrically engage corresponding termination pads provided on the upper side of the probe card so that the data/signal lines 48 on the probe card are electrically connected to the contacts on the central region.

A feature of the probing assembly 42 is its capability for probing a somewhat dense arrangement of contact pads over a large number of contact cycles in a manner that provides generally reliable electrical connection between the contacts and pads in each cycle despite oxide buildup on the pads. This capability is a function of the construction of the support element 54, the flexible membrane assembly 72 and their manner of interconnection. In particular, the membrane assembly is so constructed and connected to the support element that the contacts on the membrane assembly preferably wipe or scrub, in a locally controlled manner, laterally across the pads when brought into pressing engagement with these pads. The preferred mechanism for producing this scrubbing action is described in connection-with the construction and interconnection of a preferred membrane assembly 72a as best depicted in FIGS. 6 and 7a-7b.

FIG. 6 shows an enlarged view of the central region 80a of the membrane assembly 72a. In this embodiment, the contacts 88 are arranged in a square-like pattern suitable for engagement with a square-like arrangement of pads. Referring also to FIG. 7a, which represents a sectional view taken along lines 7a-7a in FIG. 6, each contact comprises a relatively thick rigid beam 90 at one end of which is formed a rigid contact bump 92. The contact bump includes thereon a contacting portion 93 which comprises a nub of rhodium fused to the contact bump. Using electroplating, each beam is formed in an overlapping connection with the end of a flexible conductive trace 76a to form a joint therewith. This conductive trace in conjunction with a back-plane conductive layer 94 effectively provides a controlled impedance data/signal line to the contact because its dimensions are established using a photolithographic process. The backplane layer preferably includes openings therein to assist, for example, with gas venting during fabrication.

The membrane assembly is interconnected to the flat support surface 70 by an interposed elastomeric layer 98, which layer is coextensive with the support surface and can be formed by a silicone rubber compound such as ELMER'S STICK-ALL™ made by the Borden Company or Sylgard 182 by Dow Corning Corporation. This compound can be conveniently applied in a paste-like phase which hardens as it sets. The flat support surface, as previously mentioned, is made of incompressible material and is preferably a hard dielectric such as polysulfone or glass.

In accordance with the above-described construction, when one of the contacts 88 is brought into pressing engagement with a respective pad 100, as indicated in FIG. 7b, the resulting off-center force on the rigid beam 90 and bump 92 structure causes the beam to pivot or tilt against the elastic recovery force provided by the elastomeric pad 98. This tilting motion is localized in the sense that a forward portion 102 of the beam moves a greater distance toward the flat support surface 70 than a rearward portion 104 of the same beam. The effect is such as to drive the contact into lateral scrubbing movement across the pad as is indicated in FIG. 7b with a dashed-line and solid-line representation showing the beginning and ending positions, respectively, of the contact on the pad. In this fashion, the insulative oxide buildup on each pad is removed so as to ensure adequate contact-to-pad electrical connections.

FIG. 8 shows, in dashed line view, the relative positions of the contact 88 and pad 100 at the moment of initial engagement or touchdown and, in solid-line view, these same elements after "overtravel" of the pad by a distance 106 in a vertical direction directly toward the flat support surface 70. As indicated, the distance 108 of lateral scrubbing movement is directly dependent on the vertical deflection of the contact 88 or, equivalently, on the overtravel distance 106 moved by the pad 100. Hence, since the overtravel distance for each contact on the central region 80a will be substantially the same (with differences arising from variations in contact height), the distance of lateral scrubbing movement by each contact on the central region will be substantially uniform and will not, in particular, be affected by the relative position of each contact on the central region.

Because the elastomeric layer 98 is backed by the incompressible support surface 70, the elastomeric layer exerts a recovery force on each tilting beam 90 and thus each contact 93 to maintain contact-to-pad pressure during scrubbing. At the same time, the elastomeric layer accommodates some height variations between the respective contacts. Thus, referring to FIG. 9a, when a relatively shorter contact 88a is situated between an immediately adjacent pair of relatively taller contacts 88b and these taller contacts are brought into engagement with their respective pads, then, as indicated in FIG. 9b, deformation by the elastomeric layer allows the smaller contact to be brought into engagement with its pad after some further overtravel by the pads. It will be noted, in this example, that the tilting action of each contact is locally controlled, and the larger contacts are able, in particular, to tilt independently of the smaller contact so that the smaller contact is not urged into lateral movement until it has actually touched down on its pad.

Referring to FIGS. 10 and 11, the electroplating process to construct such a beam structure, as schematically shown in FIG. 8, includes the incompressible material 68 defining the support surface 70 and the substrate material attached thereon, such as the elastomeric layer 98. Using a flex circuit construction technique, the flexible conductive trace 76a is then patterned on a sacrificial substrate. Next, a polyimide layer 77 is patterned to cover the entire surface of the sacrificial substrate and of the traces 76a, except for the desired location of the beams 90 on a portion of the traces 76a. The beams 90 are then electroplated within the openings in the polyimide layer 77. Thereafter, a layer of photoresist 79 is patterned on both the surface of the polyimide 77 and beams 90 to leave openings for the desired location of the contact bumps 92. The contact bumps 92 are then electroplated within the openings in the photoresist layer 79. The photoresist layer 79 is removed and a thicker photoresist layer 81 is patterned to cover the exposed surfaces, except for the desired locations for the contacting portions 93. The contacting portions 93 are then electroplated within the openings in the photoresist layer 81. The photoresist layer 81 is then removed. The sacrificial substrate layer is removed and the remaining layers are attached to the elastomeric layer 98. The resulting beams 90, contact bumps 92, and contacting portions 93, as more accurately illustrated in FIG. 12, provides the independent tilting and scrubbing functions of the device.

Unfortunately, the aforementioned construction technique results in a structure with many undesirable characteristics.

First, several beams 90, contact bumps 92, and contacting portions 93 (each of which may be referred to as a device) proximate one another results in different localized current densities within the electroplating bath, which in turn results in differences in the heights of many of the beams 90, contact bumps 92, and contacting portions 93. Also, different densities of the ions within the electroplating bath and "random" variations in the electroplating bath also results in differences in heights of many of the beams 90, contact bumps 92, and contacting portions 93. The different heights of many of the beams 90, contact bumps 92, and contacting portions 93 is compounded three fold in the overall height of many of the devices. Accordingly, many devices will have a significantly different height than other devices. Using membrane probes having variable device height requires more pressure to ensure that all the contacting portions 93 make adequate contact with the test device than would be required if all the devices had equal overall height. For high density membrane probes, such as 2000 or more devices in a small area, the cumulate effect of the additional pressure required for each device may exceed the total force permitted for the probe head and probe station. The excess pressure may also result in bending and breaking of the probe station, the probe head, and/or the membrane probing assembly. In addition, the devices with the greatest height may damage the pads on the test device because of the increased pressure required to make suitable contact for the devices with the lowest height.

Second, the ability to decrease the pitch (spacing) between the devices is limited by the "mushrooming" effect of the electroplating process over the edges of the polyimide 77 and photoresist layers 79 and 81. The "mushrooming" effect is difficult to control and results in a variable width of the beams 90, contact bumps 92, and contacting portions 93. If the height of the beams 90, the contact bumps 92, or the contacting portions 93 are increased then the "mushrooming" effect generally increases, thus increasing the width of the respective portion. The increased width of one part generally results in a wider overall device which in turn increases the minimum spacing between contacting portions 93. Alternatively, decreasing the height of the beams 90, the contact bumps 92, or the contacting portions 93 generally decreases the width of the "mushrooming" effect which in turn decreases the minimum spacing between contacting portions 93. However, if the height of the contacting portions 93 relative to the respective beam 90 is sufficiently reduced, then during use the rearward end of the beam 90 may sufficiently tilt and contact the test device in an acceptable location, i.e., off the contact pad.

Third, it is difficult to plate a second metal layer directly on top of a first metal, layer, such as contacting portions 93 on the contact bumps 92, especially when using nickel. To provide a bond between the contact bumps 92 and the contacting portions 93, an interface seed layer such as copper or gold is used to make an improved interconnection. Unfortunately, the interface seed layer reduces the lateral strength of the device due to the lower sheer strength of the interface layer.

Fourth, applying a photoresist layer over a non-uniform surface tends to be semi-conformal in nature resulting in a non-uniform thicknesses of the photoresist material itself. Referring to FIG. 13, the photoresist layer 79 (and 81) over the raised portions of the beams 90 tends to be thicker than the photoresist layer 79 (and 81) over the lower portions of the polyimide 77. In addition, the thickness of the photoresist 79 (and 81) tends to vary depending on the density of the beams 90. Accordingly, regions of the membrane probe that have a denser spacing of devices, the photoresist layer 79 (and 81) will be thicker on average than regions of the membrane probe that have a less dense spacing of devices. During the exposing and etching processing of the photoresist layer 79 (and 81), the duration of the process depends on the thickness of the photoresist 79 (or 81). With variable photoresist thickness it is difficult to properly process the photoresist to provide uniform openings. Moreover, the thinner regions of photoresist layer 79 (or 81) will tend to be overexposed resulting in variably sized openings. Also, the greater the photoresist layer thickness 79 (or 81) the greater the variability in its thickness. Accordingly, the use of photoresist presents many processing problems.

Fifth, separate alignment processes are necessary to align the beams 90 on the traces 76a, the contact bumps 92 on the beams 90, and the contacting portions 93 on the contact bumps 92. Each alignment process has inherent variations that must be accounted for in sizing each part. The minimum size of the contacting portions 93 is defined primarily by the lateral strength requirements and the maximum allowable current density therein. The minimum size of the contacting portions 93, accounting for the tolerances in alignment, in turn defines the minimum size of the contact bumps 92 so that the contacting portions 93 are definitely constructed on the contact bumps 92. The minimum size of the contact bumps 92, in view of the contacting portions 93 and accounting for the tolerances in alignment, defines the minimum size of the beams 90 so that the contact bumps 92 are definitely constructed on the beams 90. Accordingly, the summation of the tolerances of the contact bumps 92 and the contacting portions 93, together with a minimum size of the contacting portions 93, defines the minimum device size, and thus defines the minimum pitch between contact pads.

What is desired, therefore, is a membrane probe construction technique and structure that results in a more uniform device height, decreased spacing between devices, maximized lateral strength, desired geometries, and proper alignment.

SUMMARY OF THE INVENTION

The present invention overcomes the aforementioned drawbacks of the prior art by providing a substrate, preferably constructed of a ductile material. A tool having the desired shape of the resulting device for contacting contact pads on a test device is brought into contact with the substrate. The tool is preferably constructed of a material that is harder than the substrate so that a depression can be readily made therein. A dielectric (insulative) layer, that is preferably patterned, is supported by the substrate. A conductive material is located within the depressions and then preferably planarized to remove excess from the top surface of the dielectric layer and to provide a flat overall surface. A trace is patterned on the dielectric layer and the conductive material. A polyimide layer is then preferably patterned over the entire surface. The substrate is then removed by any suitable process.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIGS. 7a-7b are sectional views taken along lines 7a-7a in FIG. 6 first showing a contact before touchdown and then showing the same contact after touchdown and scrub movement across its respective pad.

FIG. 27 is a pictorial view of a solder bump with a mark therein as a result of the device of FIGS. 25 and 26.

FIG. 28 is a pictorial view of another alternative probing device.

DETAILED DESCRIPTION OF THE PREFERRED EMBODIMENT

The currently employed construction techniques for membrane probes involves starting with the flat rigid substrate to support additional layers fabricated thereon. To decrease the pitch and provide devices with increased uniformity requires increasingly more complex and expensive processing techniques. In direct contrast to the current techniques of constructing layers from the "bottom up" upon a supporting substrate, the present inventors came to the realization that by using a suitable tool a substrate may be coined to create the desired beams, contact bumps, and contacting portions. The remaining layers are then constructed "top down" on the beam. The substrate itself is thereafter removed.

Figure 14:
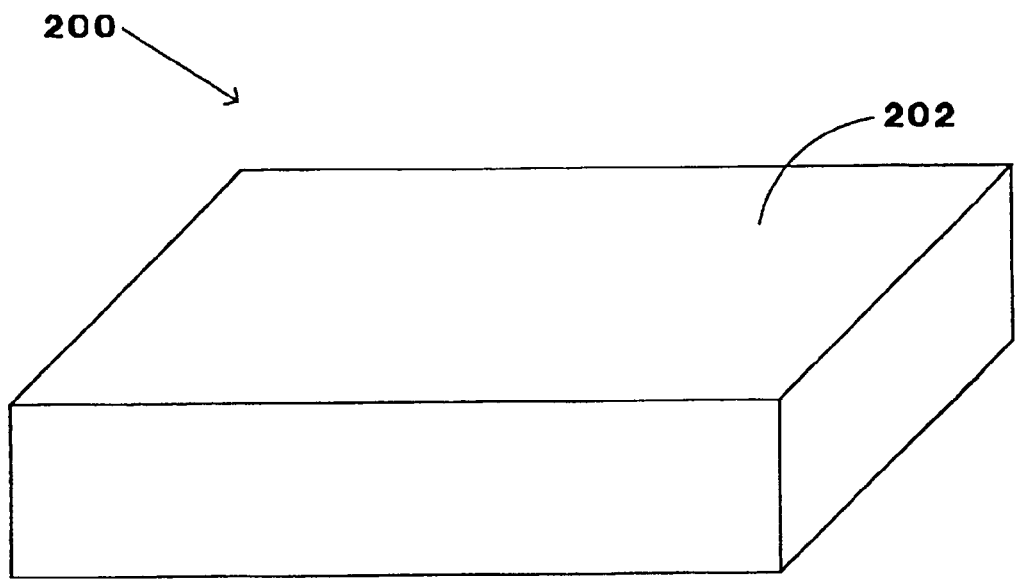
FIG. 14 is a pictorial view of a substrate.

Referring to FIG. 14, a substrate 200 is preferably constructed from a ductile material such as aluminum, copper, lead, indium, brass, gold, silver, platinum, or tantalum, with a thickness preferably between 10 mills and ⅛ inch. The top surface 202 of the substrate 200 is preferably planar and polished for optical clarity to improve viewing, as described later.

Figure 15:
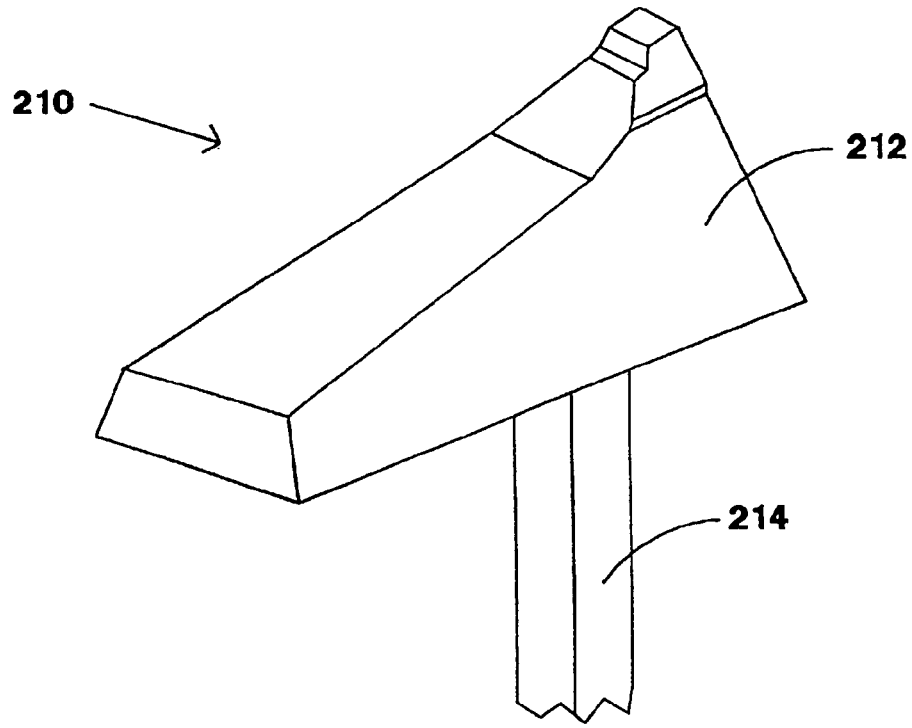
FIG. 15 is a pictorial view of an exemplary embodiment of a tool, and in particular a dimpling tool, of the present invention.
Figure 16:
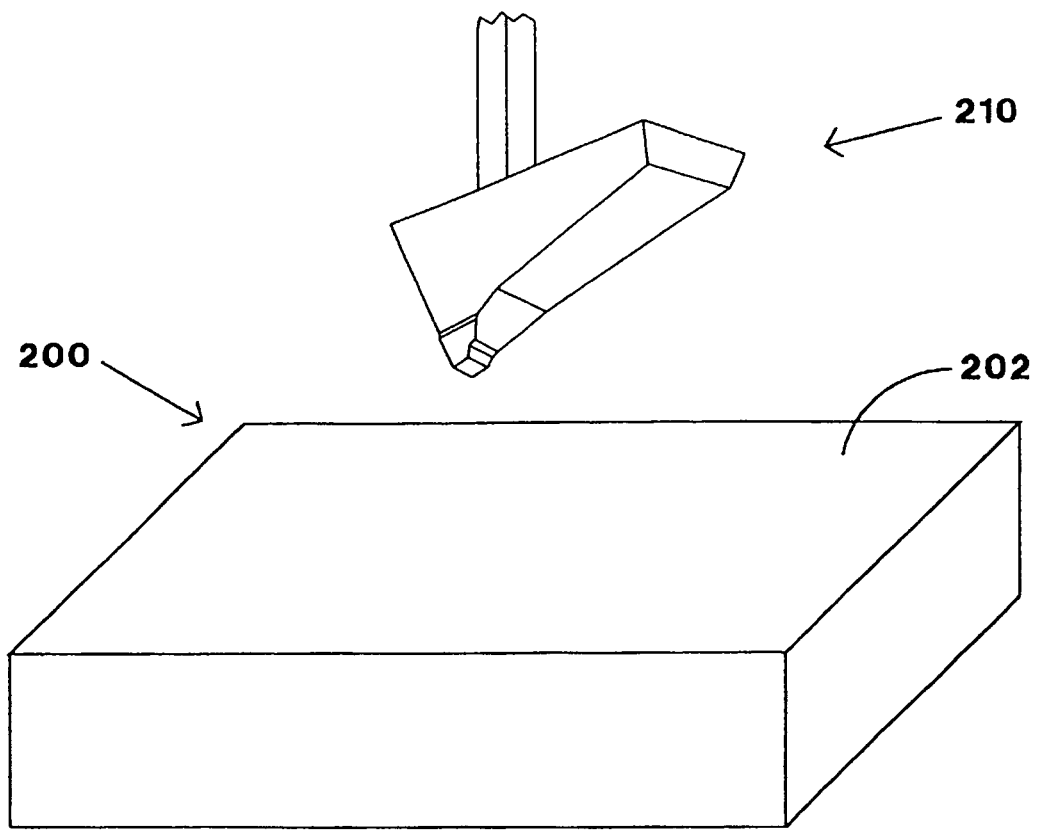
FIG. 16 is a pictorial view illustrating the tool of FIG. 15 coming into contact with the substrate of FIG. 14.
Figure 17:
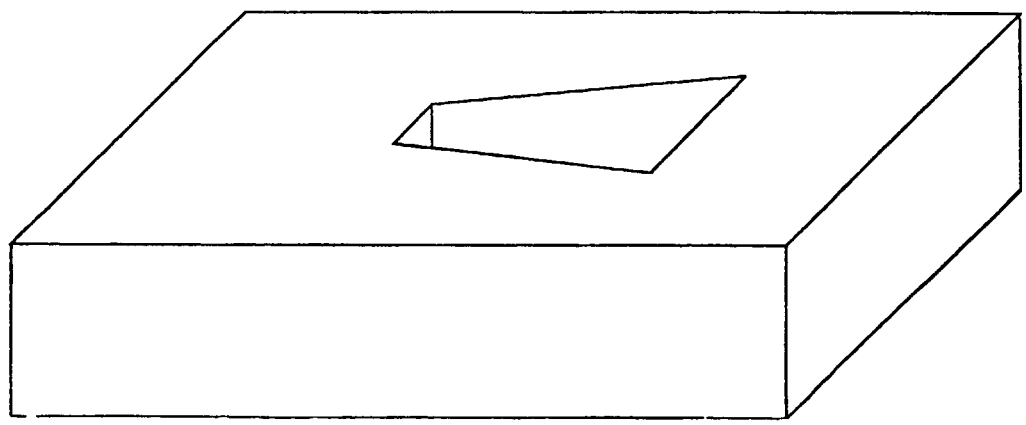
FIG. 17 is a pictorial view of the substrate of FIG. 14 after the tool of FIG. 15 has come into contact therewith.

Referring to FIG. 15, a tool and in particular a "dimpling" tool 210 is constructed with a head 212 having the desired shape of the resulting device for contacting the contact pads on the test device. The dimpling tool 210 includes a projection 214 to connect to a dimpling machine (not shown). The tool 210 is supported by the dimpling machine with the head 212 oriented to come into contact with the top surface 202 of the substrate 200. The tool 210 is preferably constructed of a material that is harder than the substrate 200 so that a dimple can be readily made therein. Suitable material for the tool 210 is, for example, tool steel, carbide, chromium, and diamond. The preferred dimpling machine is a probe station which has accurate x, y, and z control. It is to be understood that any other suitable dimpling machine may likewise be used. Referring to FIG. 16, the tool 210 is pressed into contact with the top surface 202 of the substrate 200 resulting in a depression 216 matching the shape of the tool 210 upon its removal from the substrate 200, as shown in FIG. 17. The tool 210 is used to create a plurality of depressions 216 in the substrate 200 matching the desired pattern, such as the pattern shown in FIG. 6. Conversely, the tool 210 can be held stationary and the substrate 200 can be moved in the z-direction until the top surface 202 of the substrate is pressed into contact with the tool 210 resulting in the same depression 216 matching the shape of the tool 210 upon its removal from the substrate 200, as shown in FIG. 17.

Figure 18:
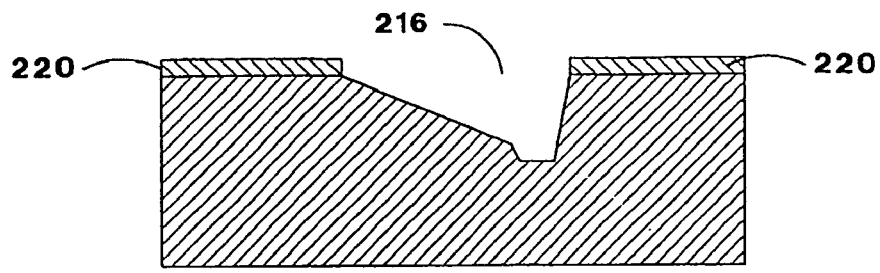
FIG. 18 is a sectional view of the substrate of FIG. 14 with a polyimide layer supported thereon.

Referring to FIG. 18, a polyimide layer 220 is patterned around the depressions 216. It is to be understood that any other suitable insulative layer or dielectric layer may likewise be used. In the process of patterning the polyimide layer 220, it is somewhat difficult to remove the polyimide from the depressions 216 during the exposing and etching process for the polyimide layer 220. This is especially true when the depressions 216 are relatively deep with steeply inclined sides. Alternatively, the polyimide layer 220 may be patterned on the top surface 202 of the substrate 200 with openings located therein where the depressions 216 are desired. Thereafter, the tool 210 is used to create the depressions 216 in the substrate 200 through the openings provided in the polyimide layer 220. This alternative technique eliminates the difficult process of adequately removing the polyimide layer 220 from the depressions 216.

It is expensive to manufacture masks for exposing the polyimide layer 220 that have tolerances sufficient to precisely align the openings for the depressions 216. The tool 210, in combination with the dimpling machine, can be aligned to the actual location of one of the openings that results from exposing and etching the polyimide layer 220 with a relatively inexpensive, and somewhat inaccurate mask. The present inventors came to the realization that localized regions of the mask, and thus the openings resulting therefrom, tend to be relatively well aligned for purposes of dimpling. Likewise, regions of the mask distant from one another tend not to be relatively well aligned for purposes of dimpling. Accordingly, automatically dimpling the substrate 200 to match an anticipated pattern with many depressions 216 distant from one another, with an accurate dimpling machine, will result in the dimpling tool not accurately being aligned with the openings at regions distant from the initial alignment point. To improve the accuracy of the alignment process the present inventors came to the realization that the dimpling machine may be realigned to the actual openings in the polyimide layer 220 at different remote locations, so that each localized region is relatively accurately aligned, while the overall alignment may be somewhat off. In this manner a relatively inexpensive mask may be used.

Figure 19:
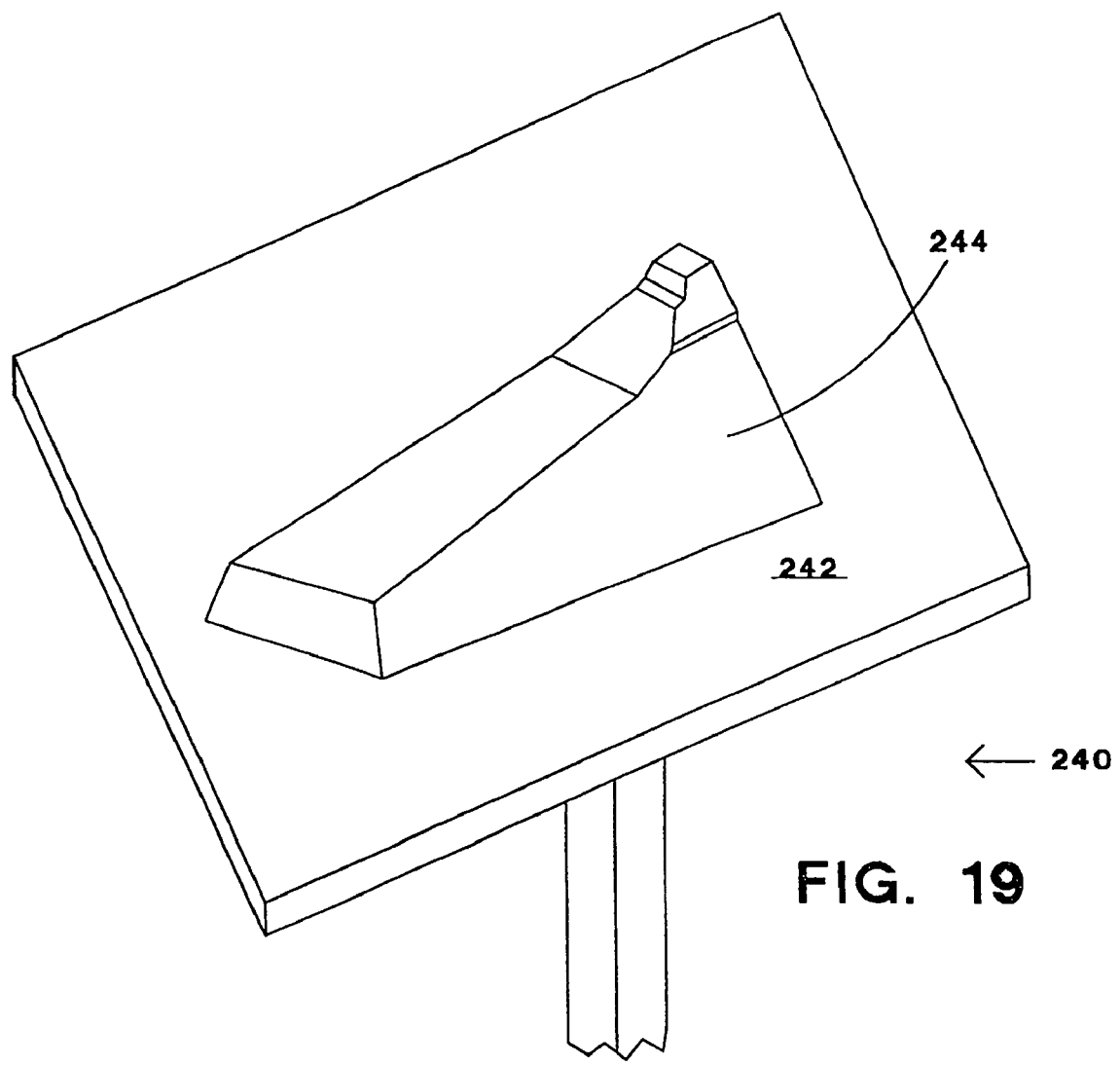
FIG. 19 is a pictorial view of the tool of FIG. 16 together with a z-axis stop.

Preferably the dimpling machine includes accurate z-axis movement so that the depth of each depression is identical, or substantially identical. Referring to FIG. 19, if sufficiently accurate z-axis movement is not available then an alternative dimpling tool 240 with a built in z-axis stop 242 may be used. The z-axis stop 242 is a projection extending outward from the head 244 that comes to rest on the top surface of the polyimide 220 or top surface 202 of the substrate 200. The z-axis stop 242 is positioned with respect to the head 244 such that the proper depth is obtained, taking into account whether or not the polyimide layer 220 is previously patterned before using the dimpling tool 240.

Figure 20:
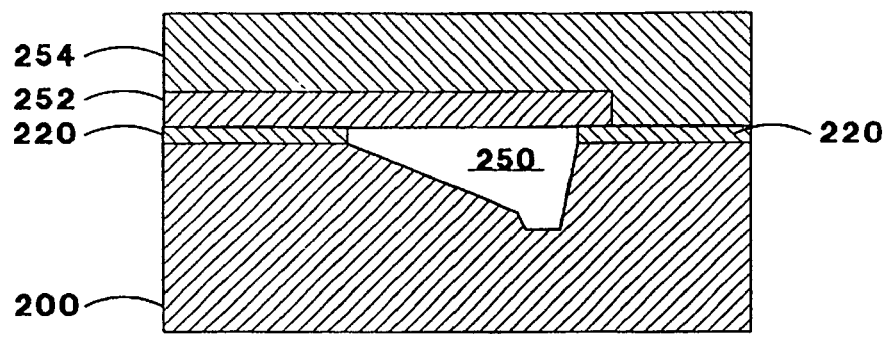
FIG. 20 is a sectional view of the substrate of FIG. 14 with a trace, conductive material in the depression, and additional polyimide layer thereon.

Referring to FIG. 20, a conductive material 250 is electroplated onto the polyimide 220 and substrate 200 thereby filling up the depressions 216 with the conductive material 250, such as nickel and rhodium. It is to be understood that any other suitable technique may be used to locate conductive material within the depressions 216. The conductive material 250 is then preferably lapped to remove excess from the top surface of the polyimide layer 220 and to provide a flat overall surface. The preferred lapping process is a chemical-mechanical planarization process. A trace 252 is patterned on the polyimide layer 220 and the conductive material 250. The trace 252 is preferably a good conductor such as copper, aluminum, or gold. A polyimide layer 254 is then patterned over the entire surface. Further layers of metal and dielectric may be formed. The substrate 200 is then removed by any suitable process, such as etching with hydrochloric acid (HCL 15%) or sulfuric acid ($H_2SO_4$). Hydrochloric acid and sulfuric acid are not reactive with the polyimide layer 220 nor the conductive material 250, such as nickel or rhodium. It is to be understood that the polyimide layer 254 may alternatively be any suitable insulator or dielectric layer.

Figure 21:
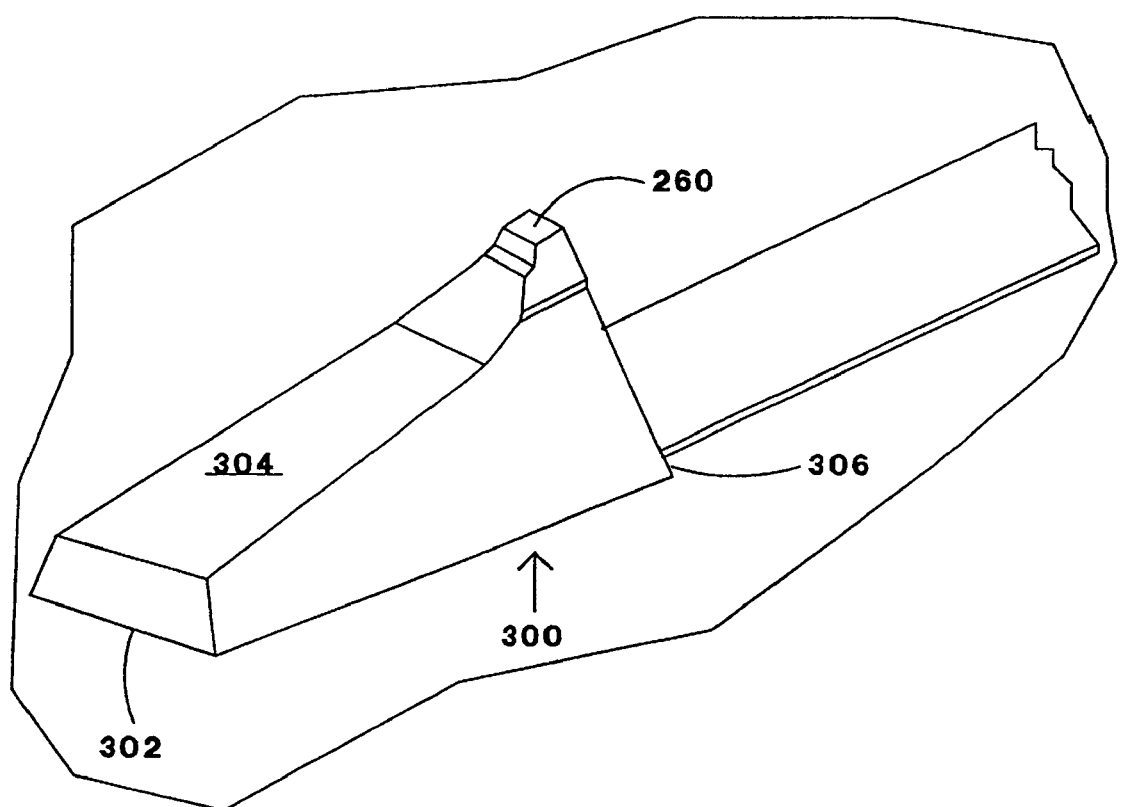
FIG. 21 is a pictorial view of the device of FIG. 20, inverted, with the substrate removed.

Referring to FIG. 21, the contacting portion 260 of the resulting device is preferably selected to have a low contact resistance so that a good electrical connection may be made with the test device. While nickel has a relatively low contact resistance, rhodium has an even lower contact resistance and is more resistant to wear than nickel. Accordingly, the depressions 216 are preferably coated with a layer of rhodium. Using normal processing techniques the thickness of rhodium is limited to approximately 5 microns. The resulting device includes an exterior layer of rhodium, and in particular the contacting portion 260, which is then filled with the remaining conductive material, such as nickel or a nonconductive fill. The conductive material need not fill the entire depression.

The aforementioned "top-down" construction process provides numerous advantages over the traditional "bottom-up" processing technique of constructing layers upon a supporting substrate. These advantages also permit the capability of constructing devices with improved characteristics.

First, there are no limitations to the height of the resulting devices which were previously imposed by limitations of photoresist processing. The ability to construct devices having any suitable height also relieves the limitations imposed by attempting to electroplate into a tall narrow openings in photoresist, which is difficult.

Second, the elevation of the contacting portions 260 of the devices is extremely uniform because it is defined solely by the tooling process, which is mechanical in nature. Different localized current densities of the electroplating bath, different densities of the ions within the electroplating bath, and "random" variations in the electroplating bath are eliminated from impacting the overall shape and height of the resulting devices. With substantially uniform elevation of the devices, less force is required for the devices to make adequate contact with the test device which, in turn, decreases the likelihood of bending and breaking the probe station, the probe head, and/or the membrane probing assembly. Also, the substantially uniform elevation of the devices decreases the likelihood of damaging contact pads on the test device with excessive pressure.

Third, the contacting portion 260 of the devices are stronger because the device is constructed of a single homogenous material during one depositing process requiring no interfacial layers, as previously required for the multiple processing steps. This permits reducing the size of the contacting portions to the limitation of the maximum current density allowable therein during testing and not the minimum sheer force of the interfacial layers.

Fourth, the shape of the resulting devices are customizable to effectively probe different materials. The shape of the device may have steep sidewall angles, such as 85 degrees, while still providing mechanical strength, stability, and integrity. The steep sidewalls permit narrower devices to be constructed which allows for a greater density of devices for increasingly denser arrangements of contact pads on the test device. Moreover, the angle of the sidewalls are not dependent (e.g. independent) on the crystalline structure of the substrate.

Fifth, the shape of the contacting portion is known precisely, and is uniform between devices, which permits uniform contact with the contact pads of the test device.

Sixth, the alignment of the different portions of the resulting device are exactly uniform between devices because each device was constructed using the same tooling process. With exact alignment of the lower portions of each device (beam and contact bump) in relation to the contacting portion, there is no need to provide additional leeway to accommodate processing variations inherent in photoresist processes and in electroplating processes. Also, the "mushrooming" effect of the electroplating process is eliminated which also reduces the required size of the device. The alignment variability reduction, and virtual elimination, of different devices 300 allows a significantly decreased pitch to be obtained, suitable for contact pads on the test device that have increased density.

Seventh, the shape of the resulting devices may be tailor shaped to provide optimal mechanical performance. To provide the scrubbing function, as described in the background portion, the device should have a beam and bump structure that tilts upon contact. The device 300 may include an inclined surface 304 between its tail 302 and the contacting portion 260. The inclined surface 304 provides for increased strength along portions of the length of the device 300 which permits the tail 302 to be thinner than its head 306. The torque forces applied to the device 300 during the tilting process of the device 300 tend to decrease over the length of the device 300 which has a correspondingly thinner material defined by the inclined surface 304. With a thinner tail 302 and material proximate the tail 302, the tail 302 of the device 300 has less likelihood of impacting the test device if excess tiling occurs. The improved shape of the device 300 also decreases the amount of metal material required.

Eighth, "look-up" cameras are used to obtain an image of the lower portion of the membrane probe to determine the precise location of the devices 300 relative to the contact pads on the test device. Using "look-up" cameras permits automatic alignment of the membrane devices relative to the contact pads so that automatic testing may be performed. In order to obtain an image of the devices 300 on the membrane probe the "look-up" cameras normally utilize light to illuminate the devices 300. Unfortunately, the traditional planar processing techniques result in relatively flat surfaces on the beams, contact bumps, and contacting portions, in a perpendicular orientation to the "look up" cameras each of which reflects light back to the "look-up" camera. The light reflecting back to the "look up" camera from all the surfaces frequently results in some confusion regarding the exact location of the contacting portions 260. The inclined surface 304 of the devices 300 tends to reflect incident light away from lowerly disposed "look-up" cameras, while the contacting portions 306 tend to reflect incident light back to lowerly disposed "look-up" cameras. Light returning to the "look-up" camera primarily from the contacting portions 306 results in less potential confusion regarding the exact location of the contacting portions.

Ninth, the initial polishing of the top surface 202 of the substrate 200 results in a matching smooth lower surface for the polyimide layer 220 patterned thereon. After etching away, or otherwise removing, the substrate 200 the lower surface of the polyimide layer 220 is smooth and the resulting polyimide layer 220 is generally optically clear. Accordingly, the spaces between the traces and the metallized devices 300 is relatively optically transmissive so that an operator positioning the device can readily see through the device between the traces and devices. This assists the operator in manually positioning the membrane probe on the devices which are otherwise obscured. In addition, the pyramidal shape of the devices 300 allows the operator to more easily determine the exact location of the contacting portions relative to the contact pads on the test device, which were previously obscured by the wide beam structures (relative to the contacting portions).

Figure 22:
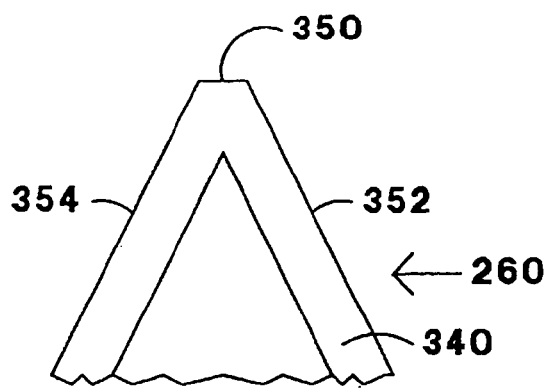
FIG. 22 is a breakaway sectional view of the contacting portion of FIG. 21.

Tenth, referring to FIG. 22, the contacting portions 260 of the device are preferably constructed with an exterior surface of rhodium 340, which typically can be effectively plated to only approximately a thickness of 5 microns. The plating process of rhodium is semi-conformal, so the resulting layer is approximately 5 microns thick in a perpendicular direction to the exterior sides 352 and 354. The width of the top 350 of the contacting portion and the angle of the sides 352 and 354 of the tool 210 is selected so that the rhodium 340 plated on both sides 352 and 254 preferably join together forming a v-shape. The remainder of the device is preferably nickel. While the thickness of the rhodium 340 is only 5 microns in a perpendicular direction, the thickness of the rhodium 340 in a perpendicular direction from the top 350 of the device is greater than 5 microns. Accordingly, the contacting portion which wears during use in a generally perpendicular direction from the top 350 will last longer than if the top portion were merely plated to a thickness of 5 microns of rhodium.

Eleventh, the texture of the contacting portion 260 may be selected to provide the described scrubbing effect on the contact pads of the test device. In particular, the tool may include a roughened surface pattern on the corresponding contacting portion to provide a uniform texture for all devices.

Thirteenth, using the construction technique of the present invention is relatively quick to construct the devices because of the decreased number of processing steps, resulting in a substantial cost savings.

The aforementioned construction technique also provides several advantages related to the shape of the devices which would be otherwise difficult, if not impossible, to construct.

First, the tool may provide any desired shape, such as a simple bump, if no scrubbing action is desired.

Second, the inclined supporting sides of the test device up to the contacting portion 260 provides superior mechanical support for the contacting portion 260, as opposed to merely a portion of metal supported by a larger contact bump. With such support from the inclined sides, the contacting portion may be smaller without risk of it becoming detached from the device. The smaller contacting portion provides improved contact with the contact pad of the test device when the device tilts to penetrate the oxide buildup on the surface of the contact pad. In addition, the tail 302 of the device may be substantially thinner than the remainder of the device which decreases the likelihood of the tail 302 portion impacting the contact pad of the test device during testing when the device tilts.

Third, the pressure exerted by the contacting portions of the devices, given a predefined pressure exerted by the probe head, is variable by changing the center of rotation of the device. The center of rotation of the device can be selected by selecting the length of the device and the location/height of the contacting portion relative thereto. Accordingly, the pressures can be selected, as desired, to match characteristics of two different contact pads.

Figure 23:
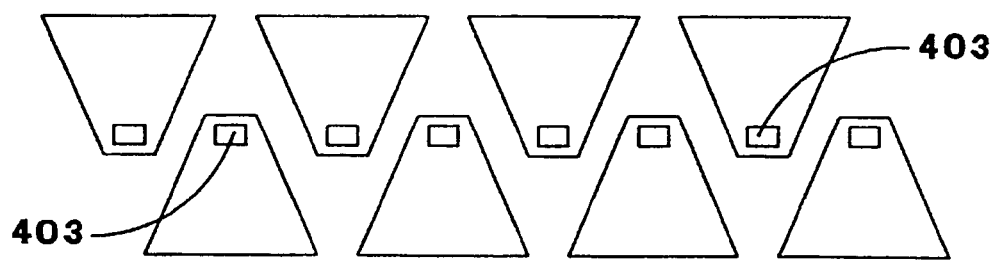
FIG. 23 is a schematic view illustrating one arrangement of the devices of the present invention.

Fourth, referring to FIG. 23, a triangular shape of the footprint of the device allows for high lateral stability of the devices while permitting a decrease in the pitch between devices. The contacting portions 403 of the device are preferably aligned in a linear arrangement for many contact pads of test devices. The triangular portions of the device are aligned in alternatively opposing directions.

Fifth, the capability of constructing contacting portions that are raised high from the lower surface of the device, while still maintaining uniformity in the device height and structural strength, allows the device to provide scrubbing action while the lower surface of the device requires little movement. The small movement of the lower surface of the device to make good electrical contact during testing decreases the stress on the layers under the lower surface of the device. Accordingly, the likelihood of cracking the polyimide layers and the conductive traces is reduced.

Figure 24:
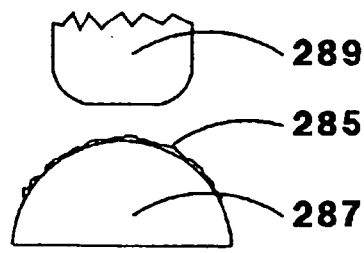
FIG. 24 is a schematic view illustrating the contact of a traditional contacting portion and the oxide layer of a solder bump.
Figure 25:
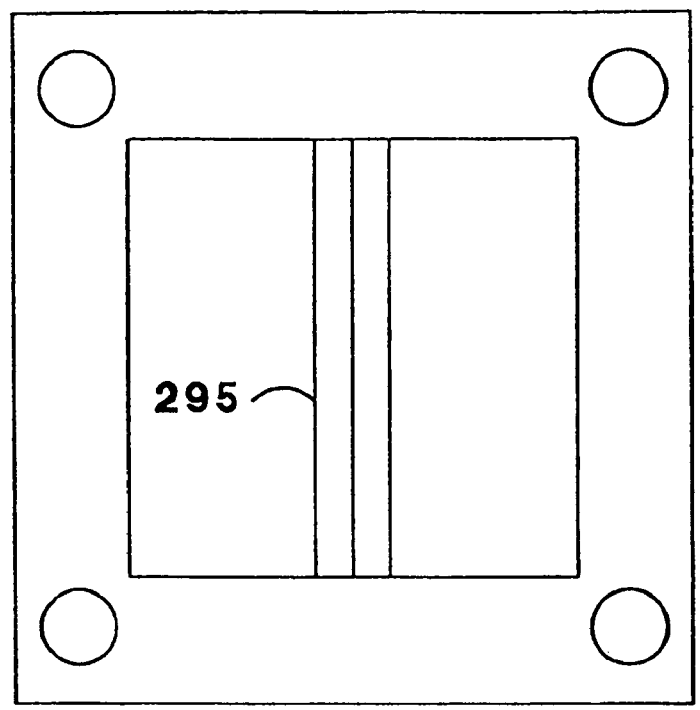
FIG. 25 is a plan view of an alternative device with an elongate probing portion.
Figure 26:
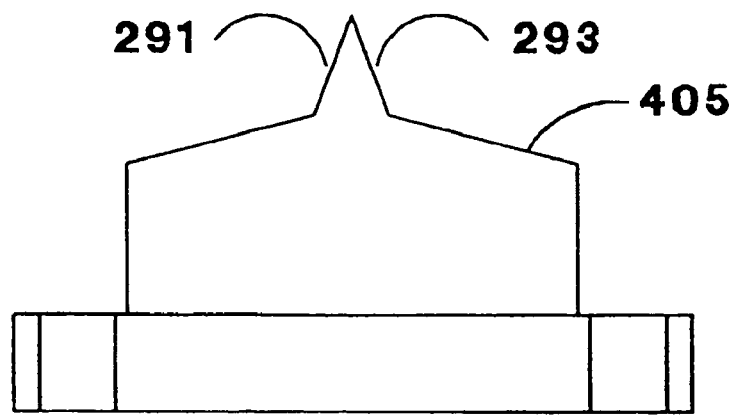
FIG. 26 is a side view of the device of FIG. 25 with an elongate probing portion.

When probing an oxide layer on solder bumps, or solder balls on wafers that are to be used with "flip-chip" packaging technology, such as the solder bumps on the printed circuit boards, the oxide layer developed thereon is difficult to effectively penetrate. Referring to FIG. 24, when contacting a traditional contacting portion of a membrane probe onto the solder bump, the oxide 285 tends to be pressed into the solder bump 287 together with the contacting portion 289 resulting in a poor interconnection. When using conventional needle probes on solder bumps, the needles tend to skate on the solder bumps, bend under within the solder bumps, collect debris on the needles, flake the debris onto the surface of the test device, and cleaning the needle probes is time consuming and tedious. Moreover, needle probes leave non-uniform probe marks on the solder bumps. When probing solder bumps used on flip-chips, the probe marks left in the upper portion of the solder bump tends to trap flux therein, which when heated tends to explode, which degrades, or otherwise destroys, the interconnection. Referring to FIGS. 25 and 26, an improved device construction suitable for probing solder bumps is shown. The upper portion of the device includes a pair of steeply inclined sides 291 and 293, such as 15 degrees off vertical, with preferably polished sides. The inclined sides 291 and 293 preferably form a sharp ridge 295 at the top thereof. The angle of the sides 291 and 293 is selected with regard to the coefficient of friction between the sides and the oxide on the solder bump, so that the oxide coated surface tends to primarily slide along the surfaces of the sides 291 and 293, or otherwise shear away, and not be significantly carried on the sides as the device penetrates a solder bump. Referring to FIG. 27, the substantially sharp ridge also provides for a mark (detent) after contact that extends across the entire solder bump. Subsequent heating of the solder bumps, together with flux, result in the flux exiting from the sides of the solder bump thereby avoiding the possibility of explosion.

In addition, the resulting mark left on the solder bumps is uniform in nature which allows manufacturers of the solder bumps to account for the resulting marks in their design. Also, less force is required to be applied to the device because it tends to slice through the solder bump rather than make pressing contact with the solder bump. The flatter surface 405 prevents slicing too deeply into the solder ball (bump).

Referring to FIG. 28, to provide a larger contact area for testing solder bumps a waffle pattern may be used.

Figure 29:
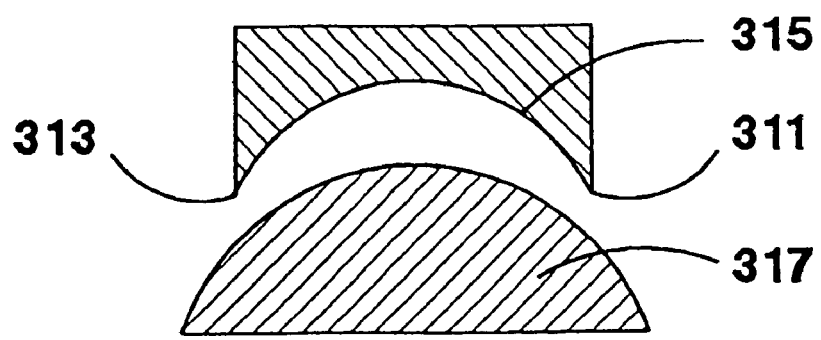
FIG. 29 is a pictorial view of a further alternative probing device suitable for solder bumps.

Referring to FIG. 29, an alternative device includes a pair of projections 311 and 313 that are preferably at the ends of an arch 315. The spacing between the projections 311 and 313 is preferably less than the diameter of the solder bump 317 to be tested. With such an arrangement the projections 311 and 313 will strike the sides of the solder bump 317 thereby not leaving a mark on the upper portion of the solder bump 317. With marks on the sides of the solder bump 317, the subsequent flux used will be less likely to become trapped within the mark and explode. In addition, if the alignment of the device is not centered on the solder bump 317 then it is highly likely that one of the projections 311 and 313 will still strike the solder bump 317.

Figure 30:
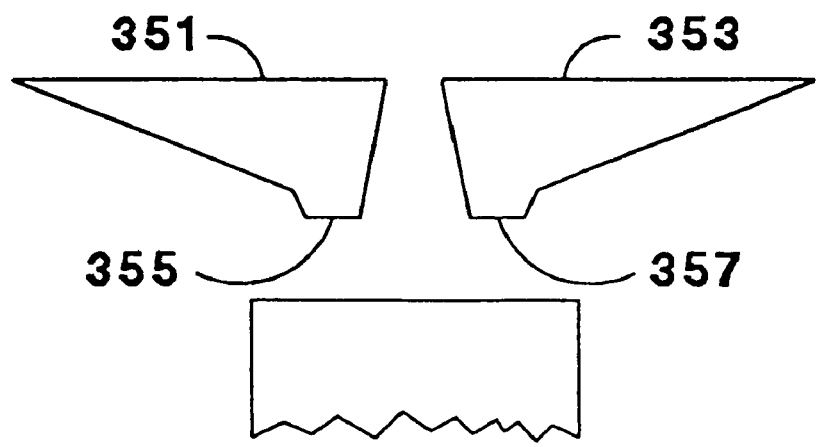
FIG. 30 is a side view of a true Kelvin connection using the devices of the present invention.

Previous device construction techniques resulted in devices that included contacting portions that were rather large and difficult to assure alignment of. Referring to FIG. 30, with the improved construction technique the present inventors came to the realization that membrane probes may be used to make a "true" Kevlin connection to a contact pad on the test device. A pair of devices 351 and 353 are aligned with their contacting portions 355 and 357 adjacent one another. With this arrangement one of the devices may be the "force" while the other device is the "sense" part of the Kelvin testing arrangement. Both contacting portions 355 and 357 contact the same contact pad on the test device. A more detailed analysis of Kelvin connections is described in Fink, D. G., ed., Electronics Engineers' Handbook, 1st ed., McGraw-Hill Book Co., 1975, Sec. 17-61, pp. 17-25, 17-26, "The Kelvin Double Bridge", and U.S. patent application Ser. No. 08/864,287, both of which are incorporated by reference herein.

It is to be noted that none to all of the aforementioned and later described advantages may be present in devices constructed accordingly to the present invention, depending on the technique used, desired use, and structure achieved.

Figure 1:
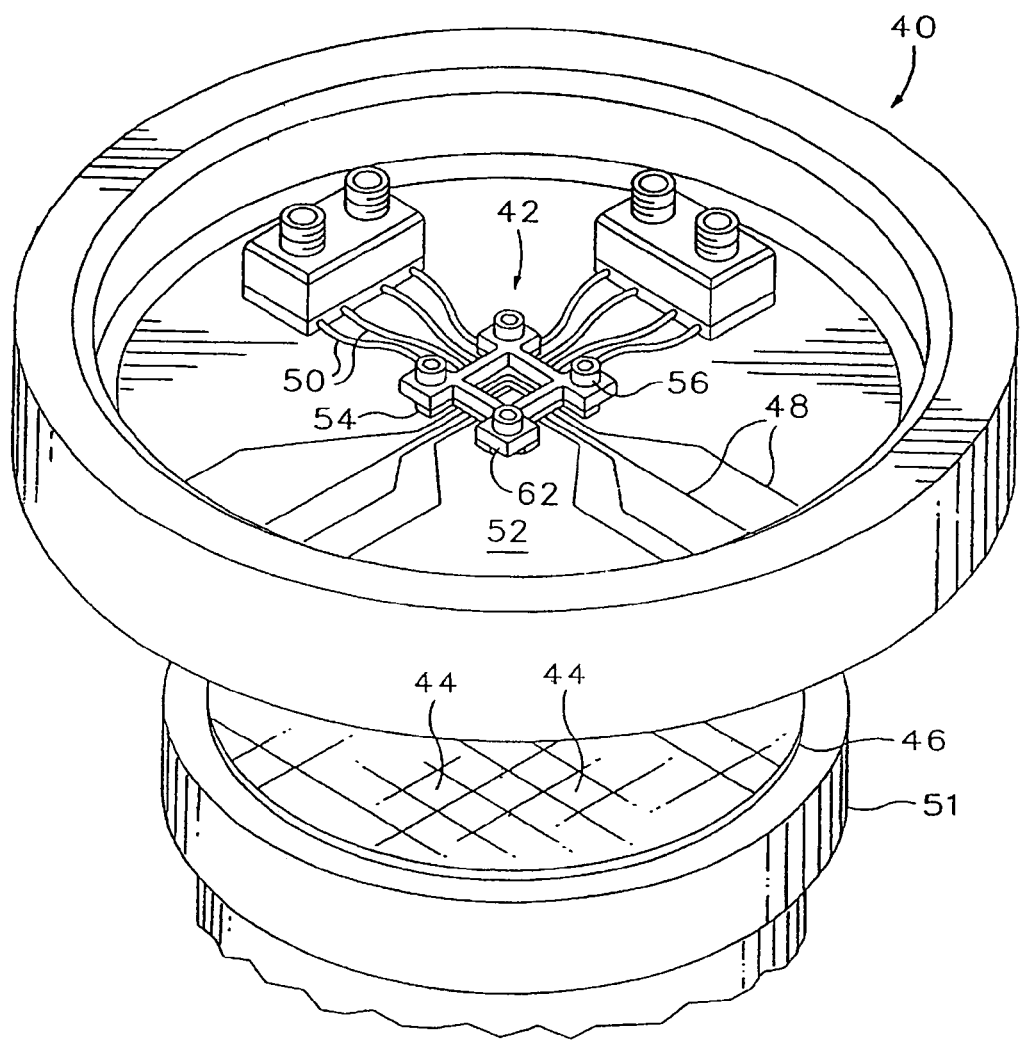
FIG. 1 is a perspective view of a membrane probing assembly bolted to a probe head and a wafer supported on a chuck in suitable position for probing by this assembly.
Figure 2:
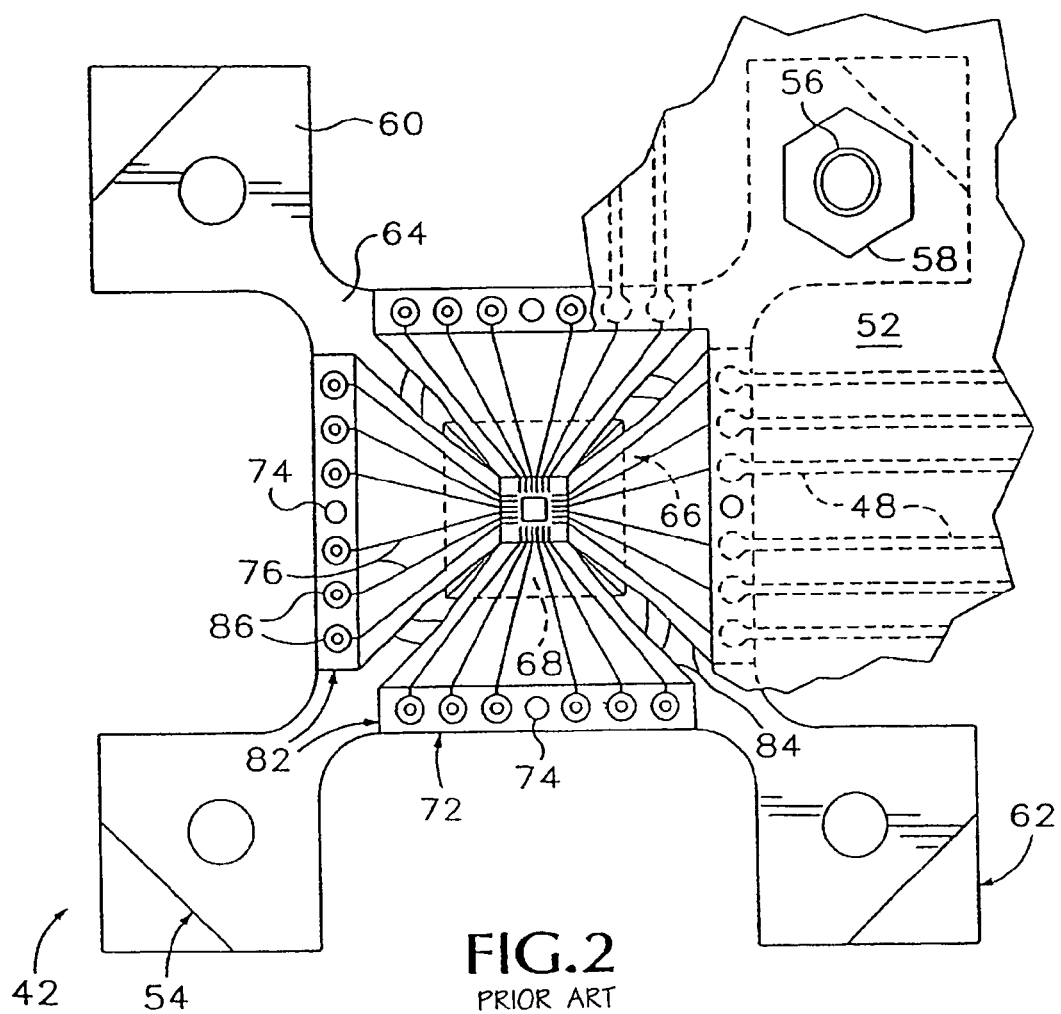
FIG. 2 is a bottom elevational view showing various parts of the probing assembly of FIG. 1, including a support element and flexible membrane assembly, and a fragmentary view of a probe card having data/signal lines connected with corresponding lines on the membrane assembly.
Figure 3:
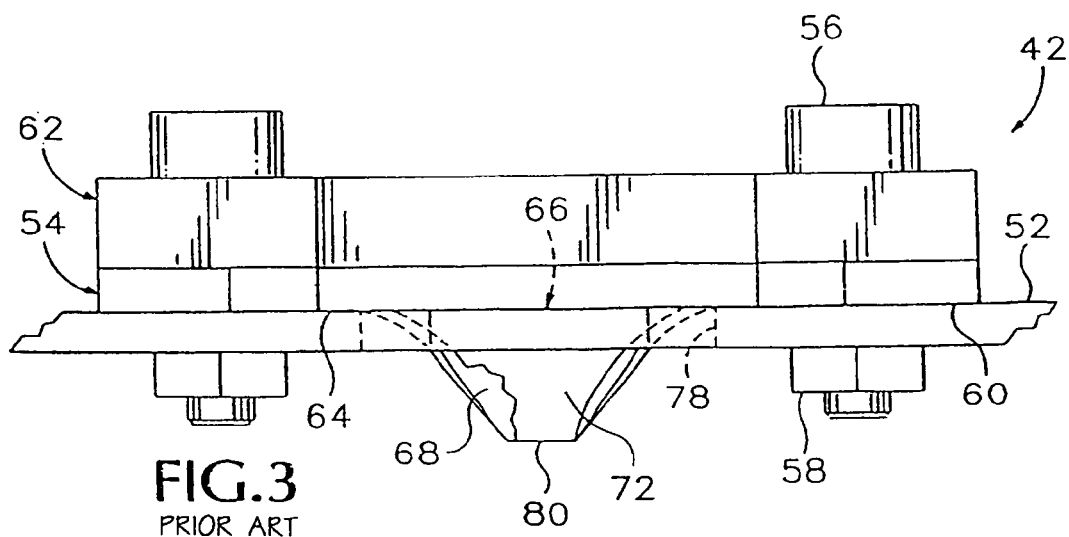
FIG. 3 is a side elevational view of the membrane probing assembly of FIG. 1 where a portion of the membrane assembly has been cut away to expose hidden portions of the support element.
Figure 4:
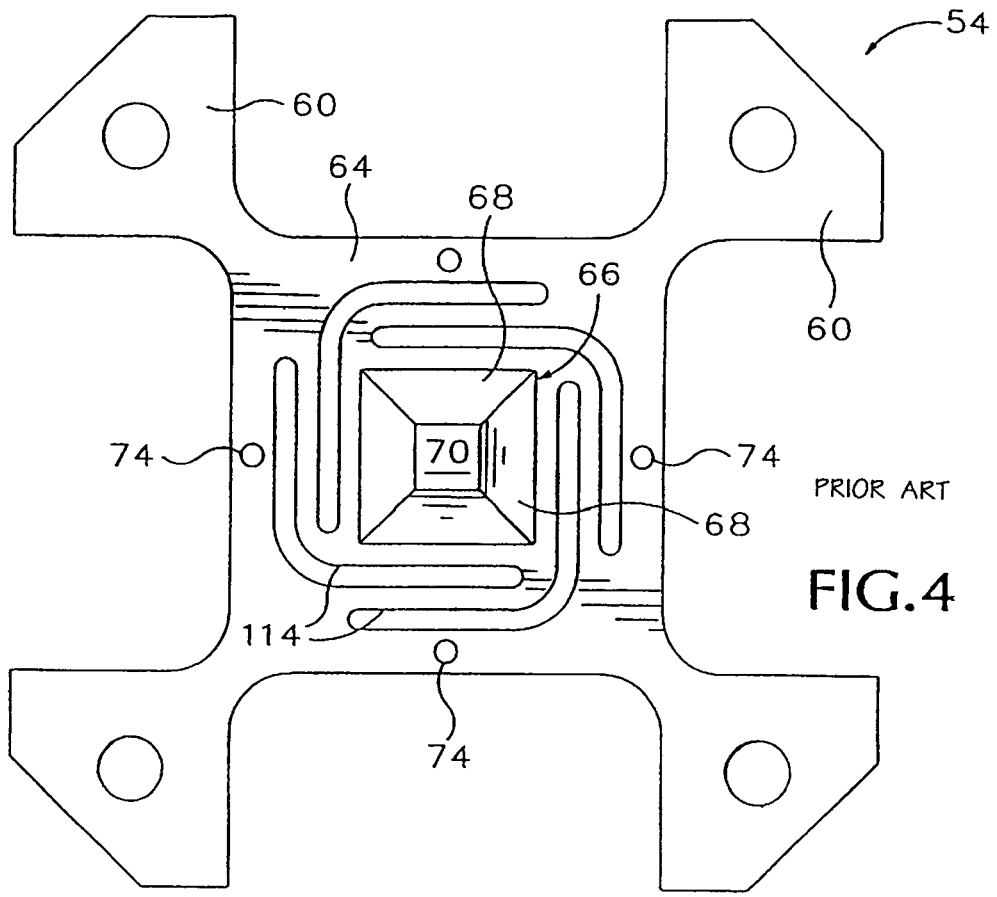
FIG. 4 is a top elevational view of an exemplary support element.
Figure 5A:
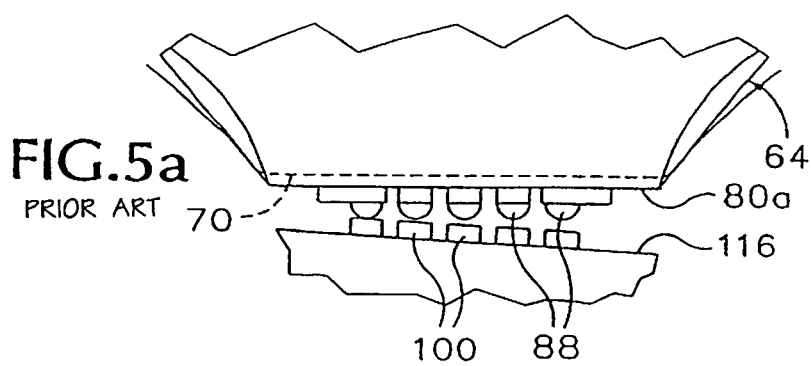
FIGS. 5a-5b are schematic side elevational views illustrating how the support element and membrane assembly are capable of tilting to match the orientation of the device under test.
Figure 5B:
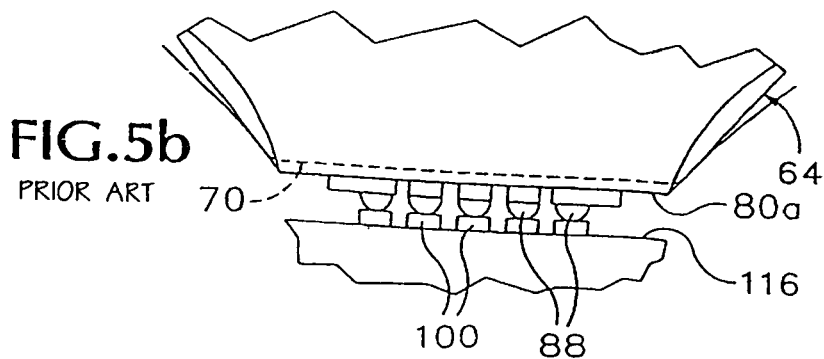

The present inventors observed that after extended use, such as 100,000 cycles, that the traces 252 tend to crack or otherwise fatigue causing the failure of one or more devices. Because the resulting pattern of contacts 88 on the membrane assembly 72*a* match the pattern of pads on the particular die area 44 on the silicon wafer 46 (see FIG. 1), the failure of one device is sufficient to render the entire membrane probing assembly 42 unusable.

After considering the cycle limitation, one potential technique proposed by the present inventors to increase the number of cycles is to fabricate thinner traces 2S2. Thinner traces 252 tend to be more resistant to cracking of otherwise fatiguing. However, thinner traces 252 have increased resistance. Increased resistance decreases the performance of the membrane probing assembly 42 by attenuating the signals, increasing heat buildup, shifting the direct current levels, and reducing the accuracy at which the signal levels are known.

Figure 31:
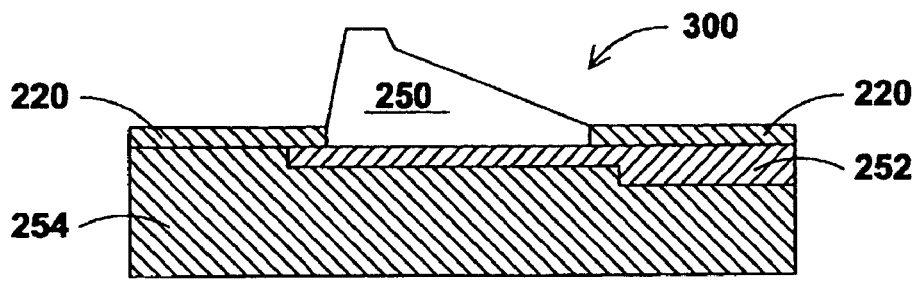
FIG. 31 is a sectional view of the substrate with a thin trace under the device, and a polyimide layer.
Figure 31:
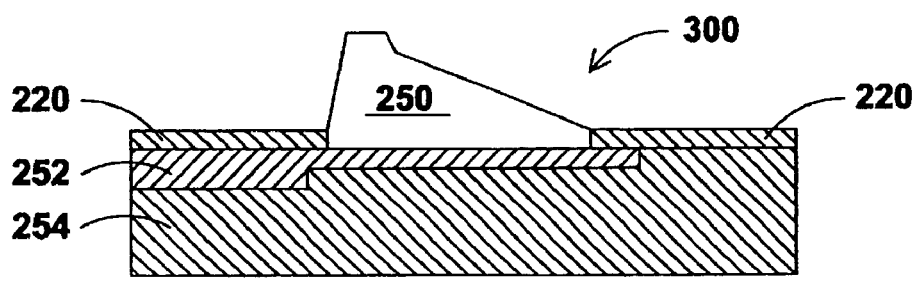
Figure 32:
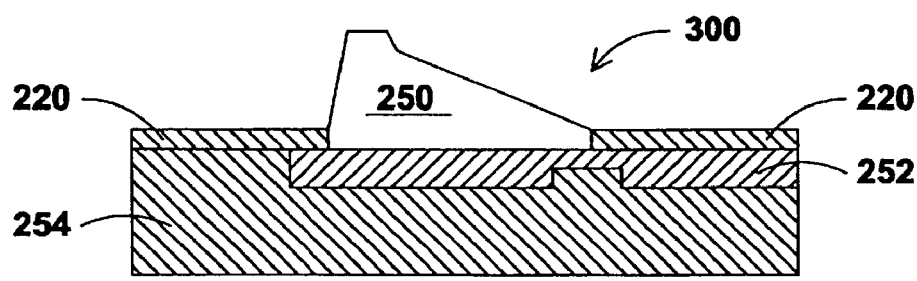
FIG. 32 is a sectional view of the substrate with a thin trace proximate the end of the device and a polyimide layer.
Figure 32:
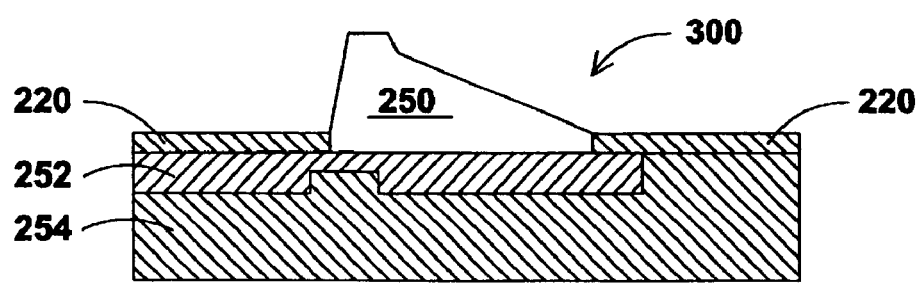
Figure 33:
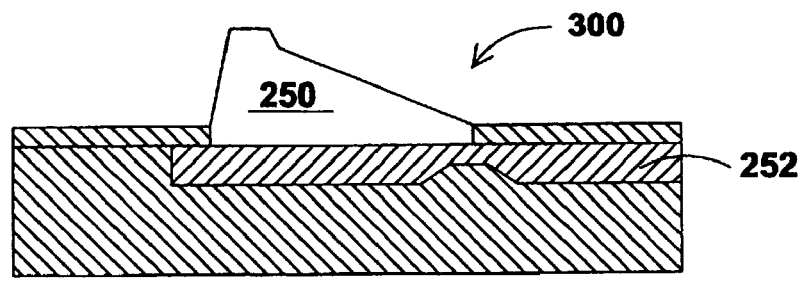
FIG. 33 is a sectional view of the substrate with a thin trace with a gradual reduction in thickness, and a polyimide layer.
Figure 34:
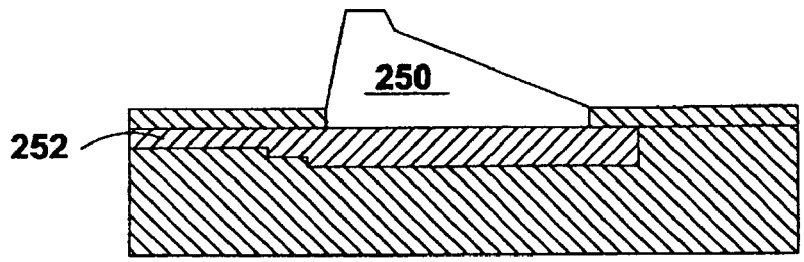
FIG. 34 is a sectional view of the substrate with a thin trace with a stepped reduction in thickness, and a polyimide layer.

The present inventors troubled by the aforementioned limitations determined that an improvement may be accomplished by fabricating thinner traces 252 in proximity to the device 300. Referring to FIG. 31, the traces 252 may be thinner under the entire device 300 or referring to FIG. 32 thinner in a region adjacent the end of the device 300. Referring to FIG. 33, the thinning of a region of the trace 252 may be any type of change, such as being a stepped or a gradual reduction, as desired. Referring to FIG. 34, a further alternative structure includes a multi-tired structure to distribute the bending along a greater length so that the trace is less likely to crack or otherwise fatigue.

Figure 35:
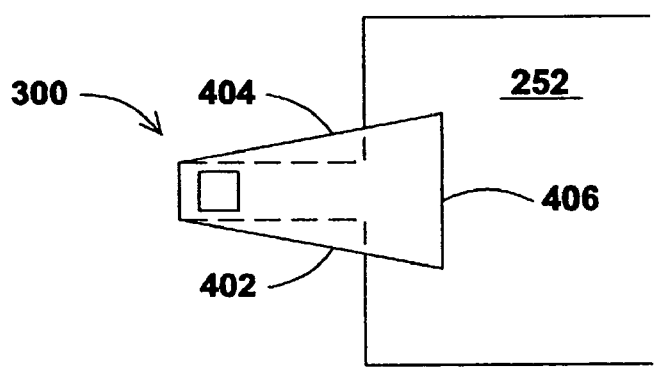
FIG. 35 is a top view of a device and a wide trace.

The present inventors then considered the three dimensional aspect of the device 300 and determined that the sides of the device may be used to further increase the length of the edge of the device 300 in contact with the trace 252. Referring to FIG. 35, the trace 252 extends both under the device 300 and has an increased width so that a portion of its sides 402 and 404 in addition to its end 406 contribute to the bending of the trace 252 thereby increasing the region over which the bending occurs. This also results in a decrease in the cracking and fatigue of the trace 252. While the overall resistance is reduced, the structure shown in FIG. 35 unfortunately may limit the pitch between different devices 300

Figure 36:
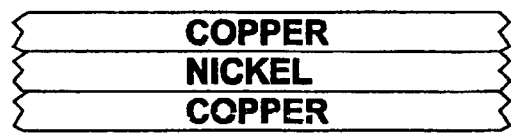
FIG. 36 is a cross sectional view of a trace.

In contrast to modifying the thickness or width of the trace 252, an alternative technique to decrease the likelihood of cracking the trace 252 is to construct the trace itself in a manner more resistant to cracking. To decrease potential cracking the trace 252 may be constructed with changes in the grain structure within the thickness of the trace 252. Referring to FIG. 36, by laminating or otherwise securing together different conductive layers, the changes in the grains of the conductive layers result in a more fatigue resistant trace 252. The preferred set of conductive layers are copper, nickel, and copper.

Figure 37:
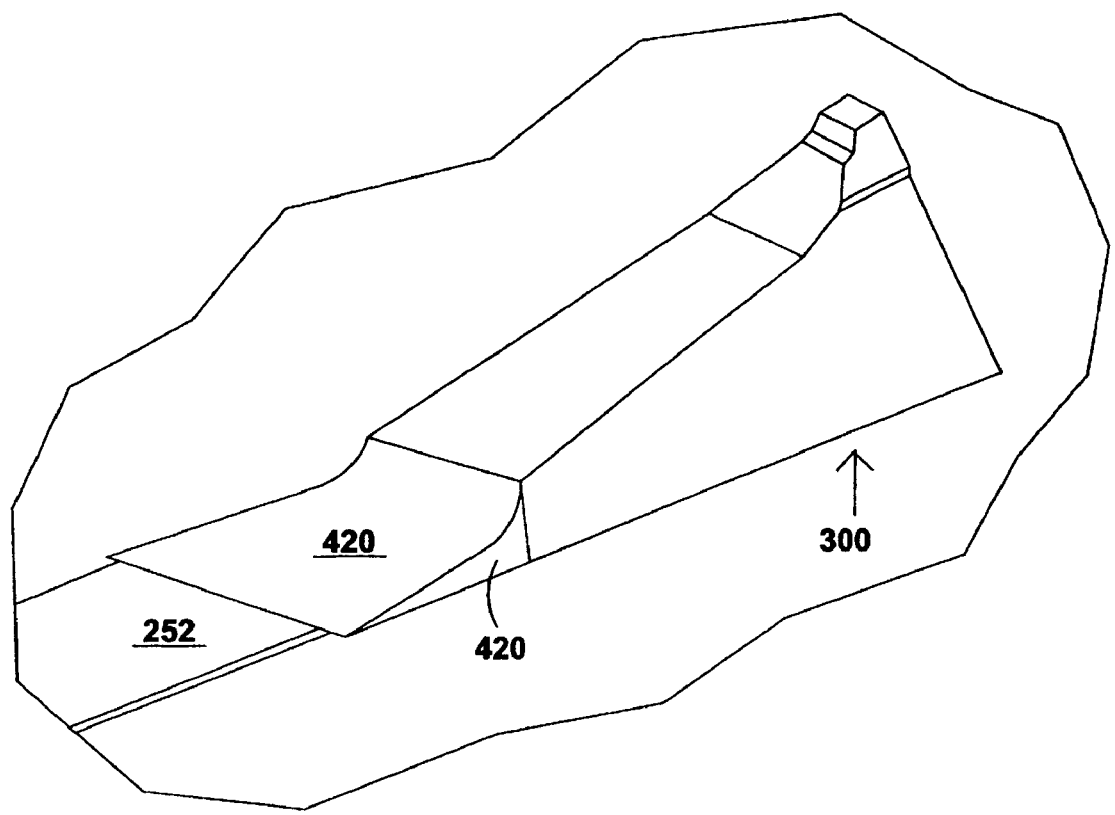
FIG. 37 is a pictorial view of the tool with a thinner portion.

In contrast to modifying the thickness, the width, or the construction of the trace 252, an alternative technique is to provide flexing within the end portion of the device 300 itself. Referring to FIG. 37, the end of the device 300 my include a thinner portion 420 having substantially more flexure than the remainder of the device 300. The flexure of the thinner portion 420 is preferably matched to the flexure of the underlying trace 252 so that the trace 252 significantly flexes along a substantial length of the thinner portion 420.

Figure 38:
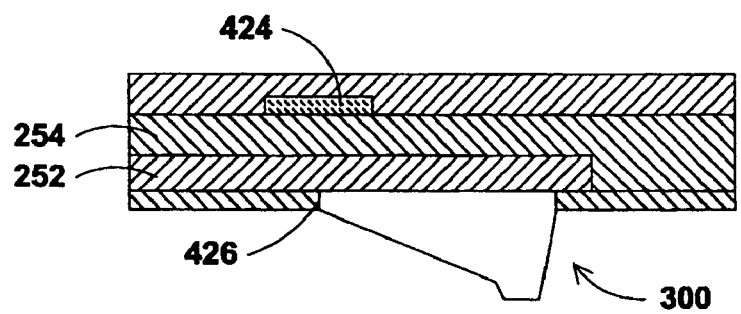
FIG. 38 is a sectional view of the substrate with an additional layer thereon.

The present inventors further determined that controlling the bending of the trace 252 may be further modified by adding an additional layer 424 in the membrane assembly 72a as exemplified by FIG. 38. The additional layer 424 is secured to the opposing side of the flexible polyimide layer 254. The additional layer 424 is typically stiffer than the polyimide layer 254, and preferably substantially stiffer. The additional layer 424 is preferably positioned such that its ends overlap the end portion 426 of the device 300. The additional layer 424, in combination with the device 300 and polyimide layer 254, distributes the radius of curvature of the trace 254 and assists in preventing "point" flexing of the trace 254. The additional layer 424 may be located at other positions and have any suitable length, as desired.

It is to be understood that any of the techniques described herein may be used individually or in combination with others, as desired.

Figure 39:
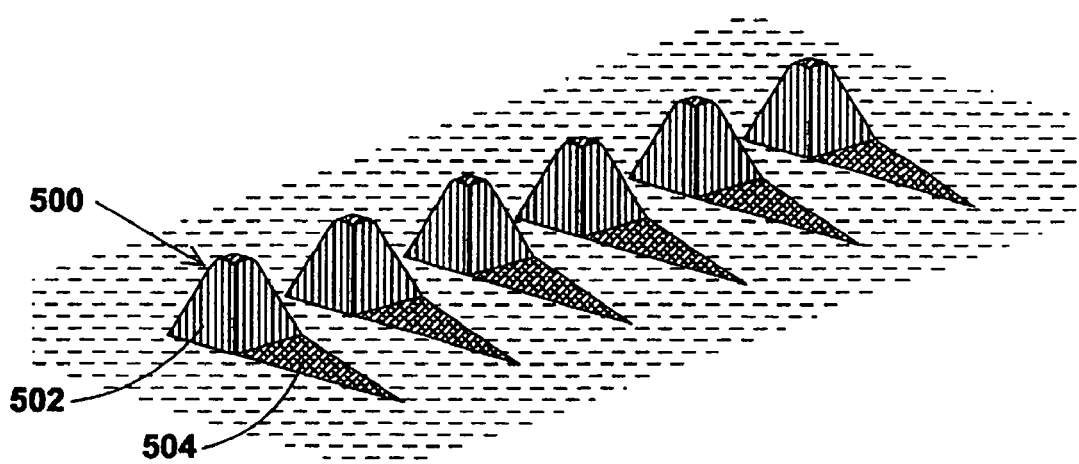
FIG. 39 is a pictorial view of the devices with pointed beam portions.
Figure 40:
FIG. 40 shows different exemplary beam profiles.
Figure 40:
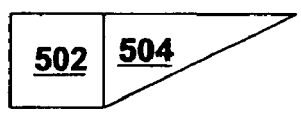
Figure 40:
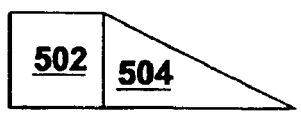
Figure 40:
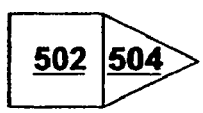
Figure 40:
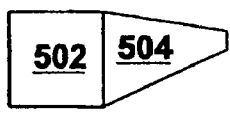
Figure 40:
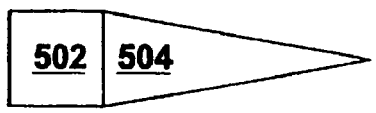
Figure 40:
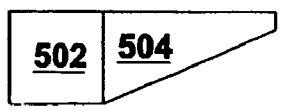

Traditional wisdom suggests that the generally rectangular shape of the device 300 provides an elongate end edge over which to distribute pressure to avoid focusing the pressure at any single point. This distribution of pressure is thought to decrease the likelihood of creating cracks in the trace after repeated usage of the device. In contrast to the traditional wisdom that the elongate end edge distributes pressure and thereby decreases the likelihood of cracking, the present inventors determined that by incorporating an elongate generally pointed beam structure the likelihood of cracking does not increase. In fact, the likelihood of cracking actually decreases thereby increasing the number of cycles that the device may be used before failure. Referring to FIG. 39, the device 500 preferably includes an upright portion 502 and an elongate beam portion 504 that generally decreases in width. The upright portion 502 is preferably pyramidal in nature and the beam portion 504 is preferably substantially flat and pointy in nature. The present inventors came to the realization that the decreasing width of the beam portion 504 provides a structure that is suitable to increasingly bend over its length which substantially increases the radius of curvature over that shown in FIG. 21. In this manner, the trace 252 tends to experience a gradual radius of curvature Several exemplary different beam portion 504 profiles are shown in FIG. 40.

Figure 41:
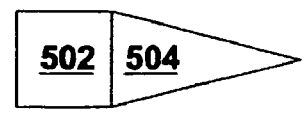
FIG. 41 shows different exemplary beam profiles.
Figure 41:
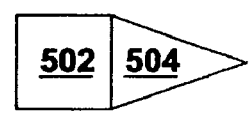
Figure 41:
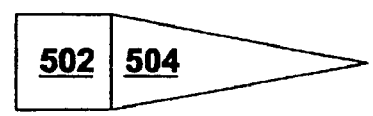
Figure 41:
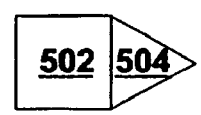
Figure 41:
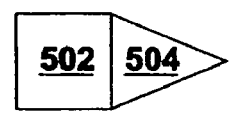
Figure 41:
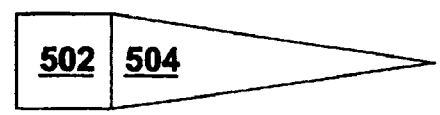
Figure 41:
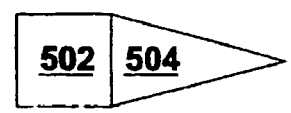
Figure 42:
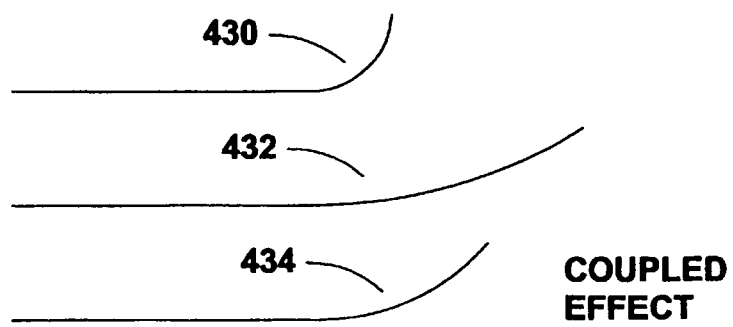
FIG. 42 illustrates multiple beam curvature profiles.

The present inventors observed that after one device 300 (500) fails then other devices adjacent the failed device 300 tend to likewise fail. The present inventors postulate that after a partial crack or other defect forms in the trace 252, then the force applied to that trace 252 by the respective device is concentrated on the remaining portion of the trace 252 resulting in more force per unit area. The increased force then tends to break the trace 252. In addition, the increased force from a totally or partially damaged trace may likewise result in damaging nearby traces 252. To overcome this cascading failure phenomena the present inventors came to the realization that the radius of curvature of several of the beam portions 504 of the devices 300 (500) should be different. In addition, the different curvature profiles tend to create pressures on the traces 252 that are not collinear in nature. Thereby, the pressures are shifted different lateral distances from the upright portions 502. Referring to FIG. 41, the different devices 300 (500) preferably have different profiles for the beam portions 504. Referring to FIG. 42, the curvature profile of single beam portions having different lengths is illustrated by curves 430 and 432. The overall radius of curvature to the traces is accordingly shown by curve 434, which provides a smooth overall curve.

Figure 6:
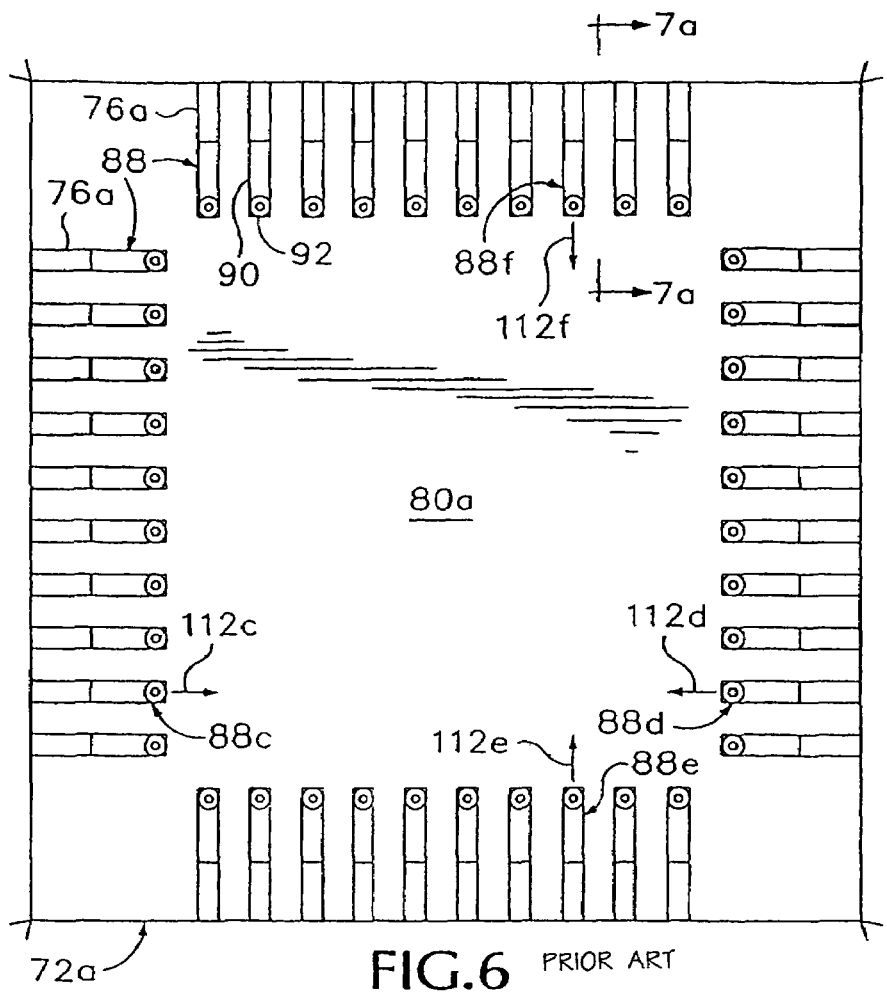
FIG. 6 is an enlarged top elevational view of the central region of the construction of the membrane assembly of FIG. 2.
Figure 8:
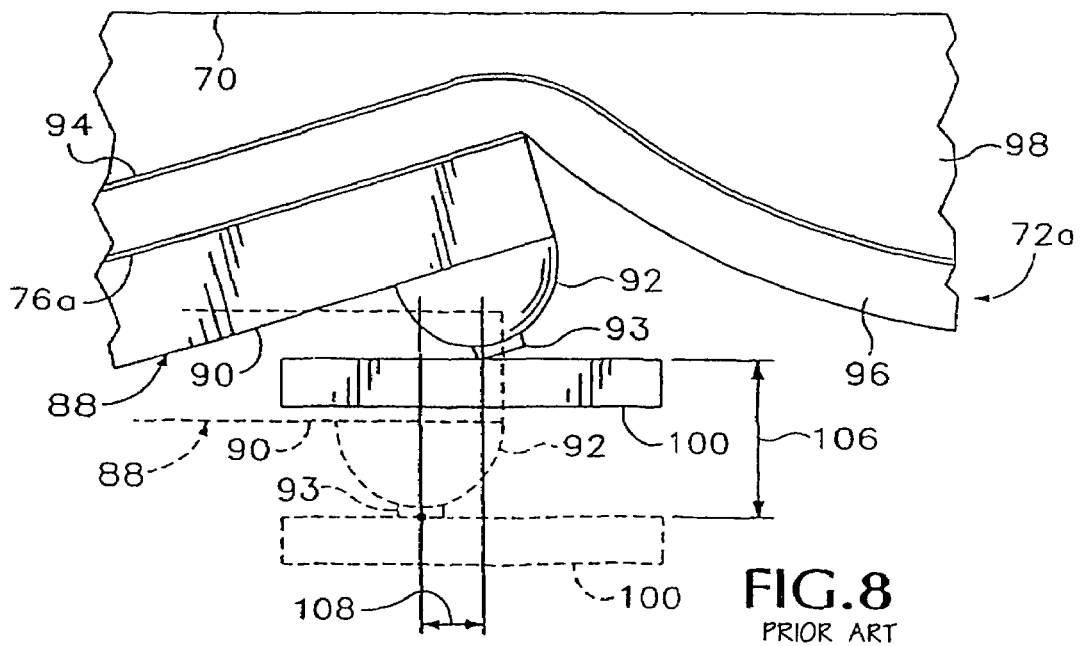
FIG. 8 is a schematic side view showing, in dashed-line representation, the contact of FIGS. 7a-7b at the moment of initial touchdown and, in solid-line representation, the same contact after further vertical overtravel by the pad.
Figure 9A:
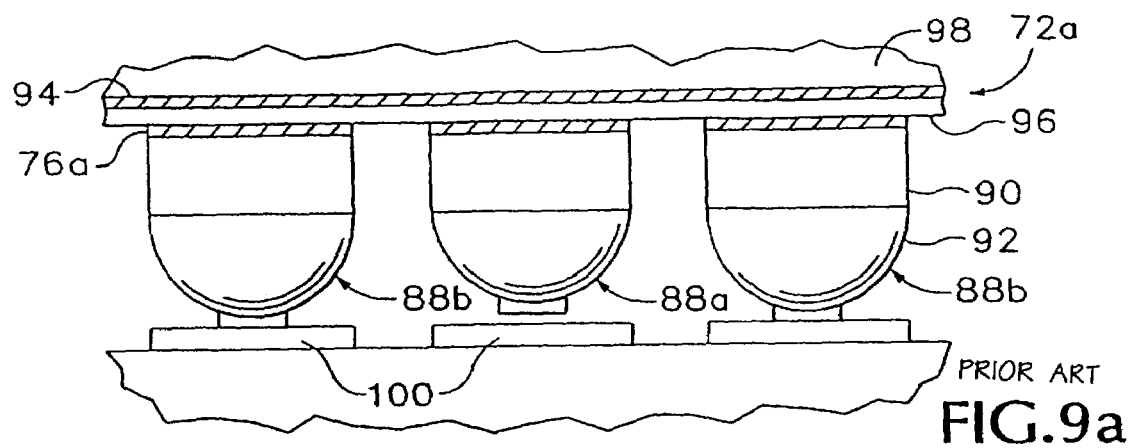
FIGS. 9a and 9b illustrate the deformation of the elastomeric layer to bring the contacts into contact with its pad.
Figure 9B:
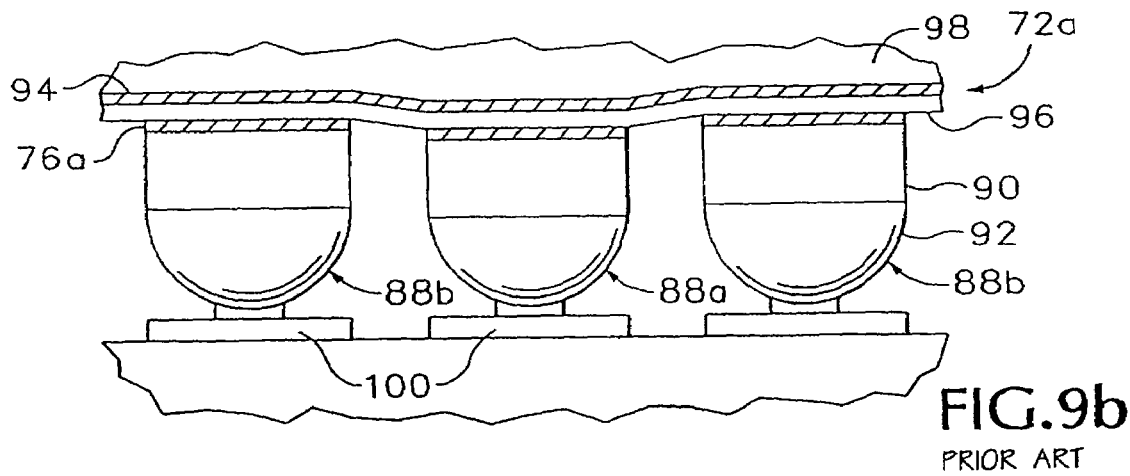
Figure 10:
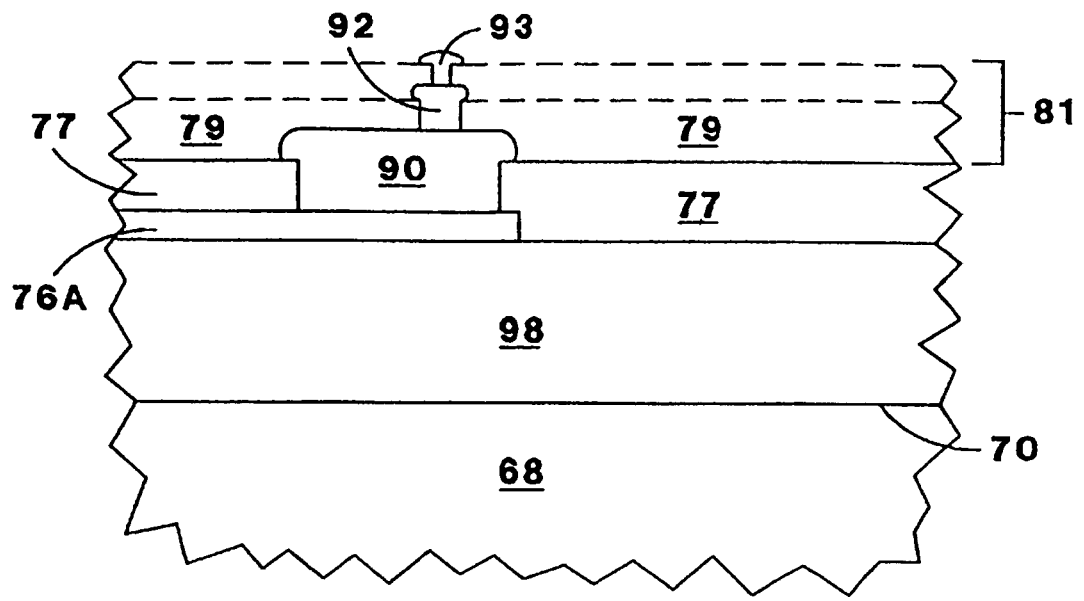
FIG. 10 is a longitudinal sectional view of the device of FIG. 8.
Figure 11:
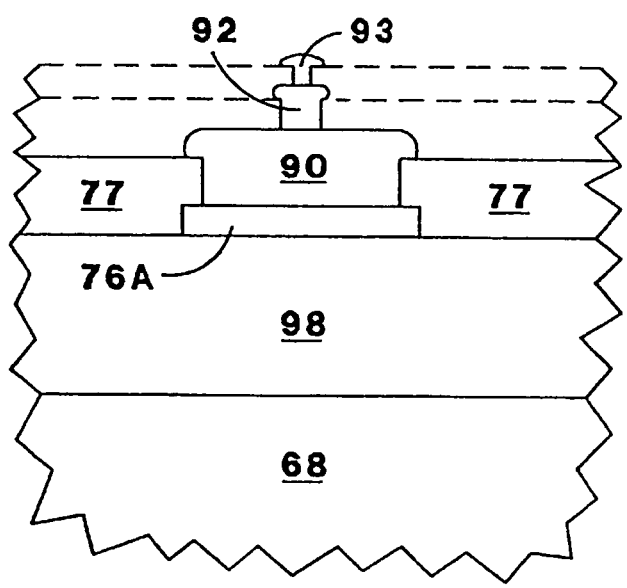
FIG. 11 is a cross sectional view of the device of FIG. 8.
Figure 12:
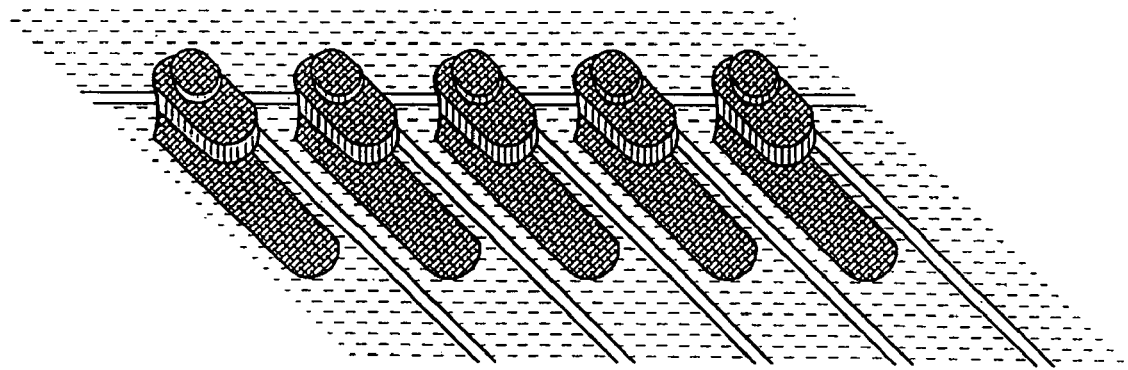
FIG. 12 is a more accurate pictorial view of the device shown in FIGS. 10 and 11.
Figure 13:
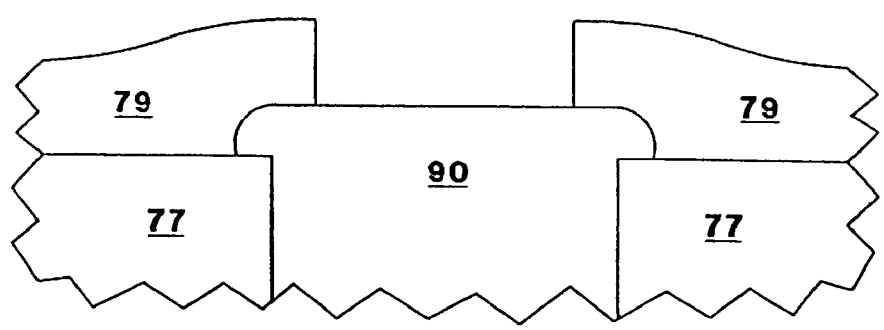
FIG. 13 is a detailed view of the device shown in FIG. 11 illustrating the uneven layers that result during processing.
Figure 43:
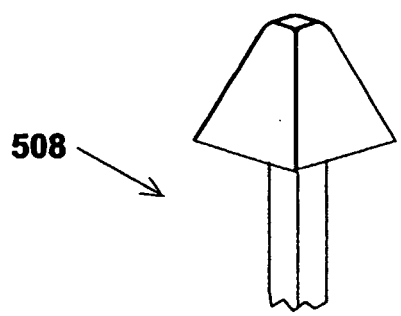
FIG. 43 shows a four-way symmetrical dimpling tool.

Referring to FIGS. 6, 15, and 17, the dimpling tool 240 needs to be properly oriented in a x-y orientation to create the depressions 216 in the proper location which in turn requires precise movement of the dimpling tool 240. When the asymmetrical dimpling tool 240 is rotated to create the depressions 216 having different orientations, the upright portion 502 needs to be realigned to the proper location. In addition, it is difficult to locate the central rotational point of the dimpling tool 240. Moreover, it is time consuming to realign the dimpling tool 240 for each different alignment. To overcome these limitations the present inventors came to the realization that a radically different device structure may be employed. Referring to FIG. 43, the raised portion of the dimpling tool 508 is preferably 4-way symmetrical. A symmetrical dimpling tool 508 alleviates the need to rotate and realign the dimpling tool 508 to create the desired pattern. In addition, it is easier to manufacture a symmetrical raised portion of the dimpling tool 508. The present inventors further realized that the polyimide layer 220 may be patterned with the desired pattern for the beam portions 504. It is relatively straightforward to pattern the polyimide layer 220 with the desired pattern for the beam portion 508 of the devices within which the raised portion of the dimpling tool 508 is aligned to create the desired depression.

Figure 44:
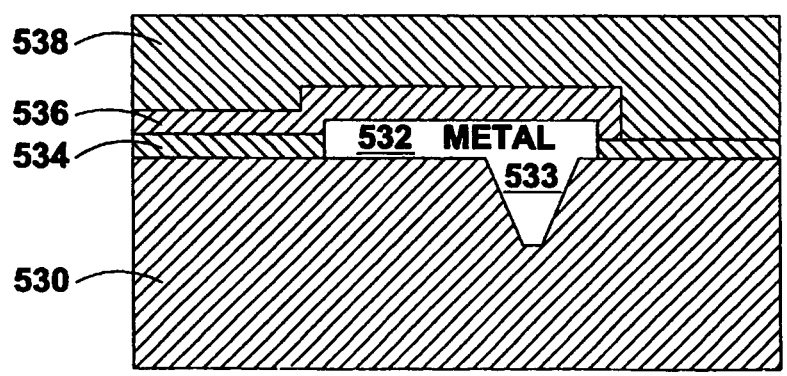
FIG. 44 is a sectional view of the substrate with a trace, conductive material in the depression, and a polyimide layer.
Figure 45:
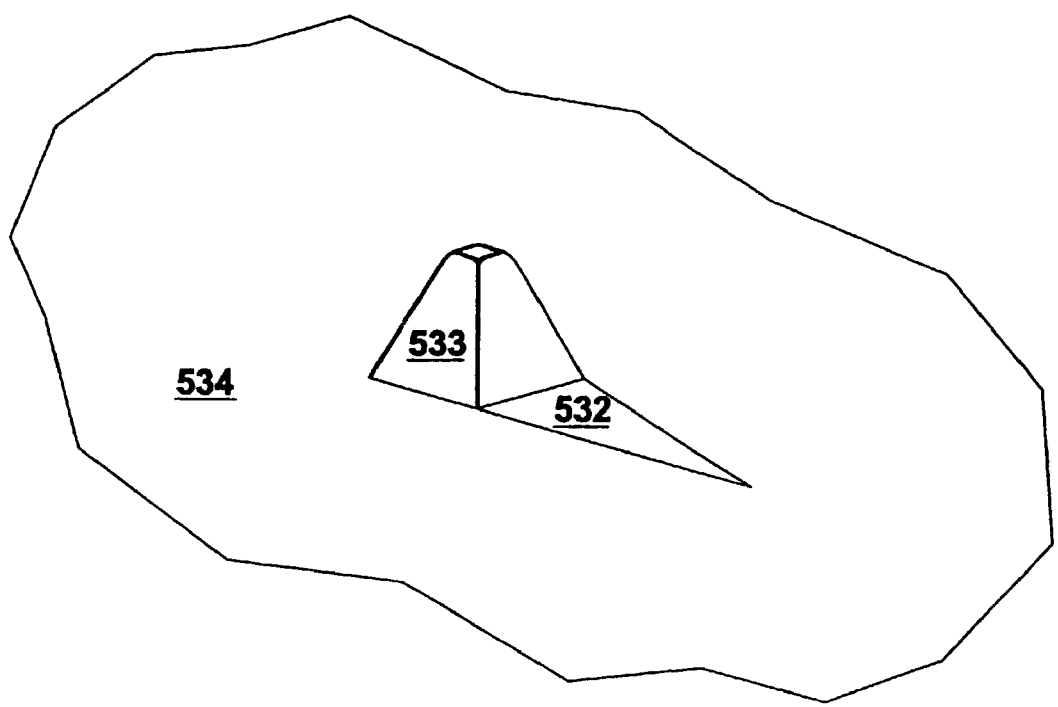
FIG. 45 is a pictorial view of the device of FIG. 44, inverted, with the substrate removed.

Referring to FIG. 44, the resulting structure includes the substrate 530, polyimide layer 534 (patterned), conductive material 532 with a symmetrical depression 533 made in the substrate 530, trace 536, and polyimide layer 538. This structure is similar in nature to that shown in FIG. 20. After the substrate 530 is removed, the beam portion is on substantially the same plane as the polyimide layer 534 as shown in FIG. 45.

Figure 46:
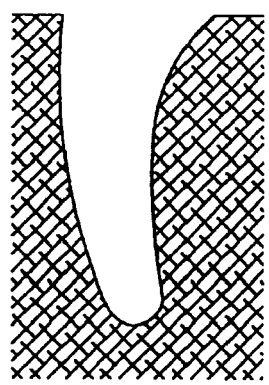
FIG. 46 shows a nonuniform depression resulting from progressively dimpling.

Referring to FIG. 46, the present inventors observed that as the dimpling tool is used to progressively create a series of depressions the resulting depressions are not uniform. After consideration of this result the present inventors came to the realization that, with increasingly finer pitch, the dimpling tool upon impact pushes the substrate into proximate depressions already created. The resulting depressions are non-uniform in nature and difficult to plate with metal if the bottom is unusually thin. The resulting non-uniform devices tend to probe non-uniformly, tend to bend under pressure, and prematurely break if thin. To increase the uniformity the present inventors came to the realization that the upright portion 502 should be a "tall" narrow pyramidal shape. Such a shape for an upright portion permits progressive dimpling while leaving previously created openings substantially unaffected. Another technique that may be employed to increase the depression uniformity is to create the depressions by multiple increasingly deeper impacts of the dimpling tool with the substrate. In other words, the first impact of the dimpling tool with the substrate should be of limited depth while the subsequent impact(s) have increasing depth up the desired depth.

Figure 47:
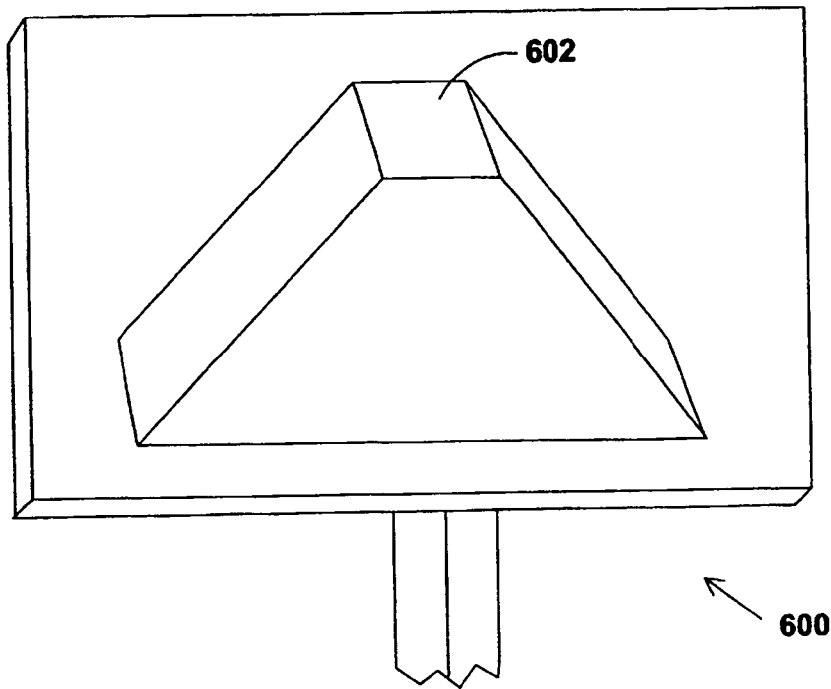
FIG. 47 shows a two-way symmetrical dimpling tool.

While a 4-way symmetrical dimpling tool has many advantages it has somewhat limited potential pitch. To increase the pitch of the-devices (density) a 2-way asymmetrical dimpling tool 600 may be employed, as shown in FIG. 47. The narrow width and substantially longer length of the dimpling tool 600 permits any air contained within the depression formed in the substrate and bubbles formed during plating to easily escape. In addition, the narrow width permits a small pitch to be achieved. The sides of the dimpling tool may be parallel or slightly inclined, as desired.

Figure 48:
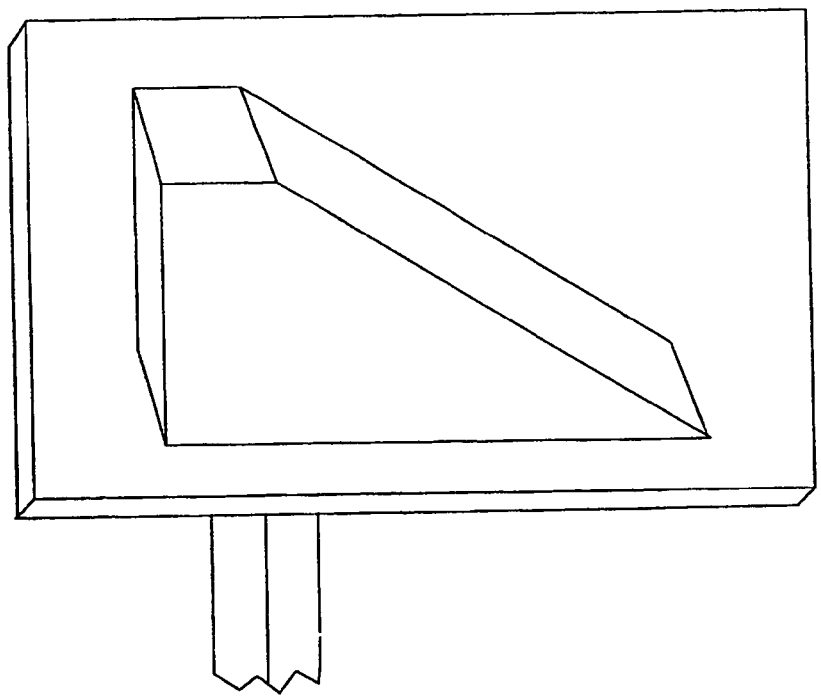
FIG. 48 shows a one-way symmetrical dimpling tool.

While the device shown in FIG. 47 is advantageous, it may be difficult to accurately align the contacting portions 602 because they may be partially obscured by the device itself. To provide a device that is easier to align the contacting portions may be located at one of the extreme ends, as shown in FIG. 48.

What is claimed is:

1. A method of constructing a membrane probe comprising:
   (a) providing a substrate;
   (b) creating a depression within said substrate;
   (c) locating conductive material within said depression;
   (d) connecting a flexible conductive trace to said conductive material, said trace comprising a first length portion having a first width and a first thickness and a second length portion having a second width and a second thickness, at least one of said first width and said first thickness varying from, respectively, said second width and said second thickness; and
   (e) removing said substrate from said conductive material.

2. The method of constructing a membrane probe of claim 1 wherein said first length portion of said conductive trace is proximate said connection of said trace to said conductive material and said second length portion is more remote from said connection to said conductive material than said first length portion and said first thickness is less than said second thickness.

3. The method of constructing a membrane probe of claim 1 wherein said first length portion of said conductive trace is proximate said connection of said trace to said conductive material and said second length portion is more remote from said connection to said conductive material than said first length portion and said first width is less than said second width.

4. A method of constructing a membrane probe comprising:
   (a) providing a substrate;
   (b) creating a depression within said substrate;
   (c) locating conductive material within said depression, said conductive material including a connecting surface having a connecting surface length extending between a first edge and a second edge;
   (d) connecting a flexible conductive trace to said conductive material, said trace comprising a first length portion having a first width and a first thickness and a length at least co-extensive with said connecting surface length and a second length portion having a second width and a second thickness, at least one of said first width and said first thickness varying from, respectively, said second width and said second thickness; and
   (e) removing said substrate from said conductive material.

5. The method of constructing a membrane probe of claim 4 wherein said first thickness is less than said second thickness.

6. The method of constructing a membrane probe of claim 4 wherein said first width is less than said second width.

7. The method of constructing a membrane probe of claim 4 wherein said first length portion extends from a first end portion situated to a first side of said first edge of said connecting surface and a second end portion situated to a second side of said first edge, said first thickness being less than said second thickness.

8. A method of constructing a membrane probe comprising:
   (a) providing a substrate;
   (b) creating a depression within said substrate;
   (c) locating conductive material within said depression, said conductive material including a connecting surface having a connecting surface length extending between a first edge and a second edge;
   (d) connecting a conductive trace to said conductive material, said trace comprising:
      (i) a first length portion having a first width and a first thickness and extending from a first end portion situated to a first side of said first edge of said connecting surface and a second end portion situated to a second side of said first edge;
      (ii) a second length portion having a second width and a second thickness, said first thickness being less than said second thickness; and
      (iii) a third length portion extending from said second end portion of said first length portion to a point situated more remote from said first edge of said connecting surface than said second end portion of said first length portion, said third length portion having a thickness greater than said first thickness; and
   (e) removing said substrate from said conductive material.

9. A method of constructing a membrane probe comprising:
   (a) providing a substrate;
   (b) creating a depression within said substrate;
   (c) locating conductive material within said depression, said conductive material including a connecting surface having a connecting surface length extending between a first edge and a second edge;
   (d) connecting a conductive trace to said conductive material, said trace comprising:
      (i) a first length portion having a first width and a first thickness and a length at least co-extensive with said connecting surface length;

(ii) a second length portion having a second width and a second thickness and extending from an end of said first length portion, at least one of said first width and said first thickness varying from, respectively, said second width and said second thickness; and (iii) a third length portion extending from a second end of said second length portion; said second thickness being less than one of said first thickness and a thickness of said third length portion and greater than the other of said first thickness and said thickness of said third length portion; and (e) removing said substrate from said conductive material.

10. A method of constructing a membrane probe comprising:

(a) providing a substrate;

(b) creating a depression within said substrate;

(c) locating conductive material within said depression, said conductive material including a connecting surface;

(d) connecting a first conductive trace to said connecting surface, said conductive trace having a thickness defined by a first surface remote from said connecting surface;

(e) connecting a second conductive trace to said first surface of said first conductive trace, said second conductive trace having a thickness defined by a second surface remote from said first surface of said first conductive trace; and (f) removing said substrate from said conductive material.

11. The method of constructing a membrane probe of claim 10 wherein said first conductive trace comprises a first conductor and said second conductive trace comprises a second conductor.

12. The method of constructing a membrane probe of claim 11 wherein said first conductor comprises copper and said second conductor comprises nickel.

13. The method of constructing a membrane probe of claim 10 further comprising the step of connecting a third conductive trace to said second surface of said second conductive trace.

14. The method of constructing a membrane probe of claim 10 wherein said first conductive trace comprises a first conductor, said second conductive trace comprises a second conductor and said third conductive trace comprises a conductor different from said second conductor.

15. The method of constructing a membrane probe of claim 14 wherein said first conductor and said third conductor comprise copper and said second conductor comprises nickel.

\* \* \* \* \*